(12) United States Patent
Weiser et al.

(10) Patent No.: US 8,889,322 B2
(45) Date of Patent: *Nov. 18, 2014

(54) PHOTOPOLYMER FORMULATION HAVING DIFFERENT WRITING COMONOMERS

(75) Inventors: Marc-Stephan Weiser, Leverkusen (DE); Friedrich-Karl Bruder, Krefeld (DE); Thomas Rölle, Leverkusen (DE); Thomas Fäcke, Leverkusen (DE); Dennis Hönel, Zülpich-Wichterich (DE); Jörg Hofmann, Krefeld (DE)

(73) Assignee: Bayer MaterialScience AG, Leverkusen (DE)

(*) Notice: Subject to any disclaimer, the term of this patent is extended or adjusted under 35 U.S.C. 154(b) by 179 days.

This patent is subject to a terminal disclaimer.

(21) Appl. No.: 13/504,429

(22) PCT Filed: Nov. 2, 2010

(86) PCT No.: PCT/EP2010/066594
§ 371 (c)(1),
(2), (4) Date: May 29, 2012

(87) PCT Pub. No.: WO2011/054797
PCT Pub. Date: May 12, 2011

(65) Prior Publication Data
US 2012/0231377 A1      Sep. 13, 2012

(30) Foreign Application Priority Data

Nov. 3, 2009   (EP) ..................... 09013769

(51) Int. Cl.
*G03H 1/02*       (2006.01)
*C08G 18/79*      (2006.01)
(Continued)

(52) U.S. Cl.
CPC .............. *G11B 7/245* (2013.01); *C08G 18/792* (2013.01); *G03F 7/001* (2013.01);
(Continued)

(58) Field of Classification Search
CPC .............. C08G 18/792; C08G 18/485; C08G 18/7831; C08G 18/44; C08G 18/4277; C08G 18/10; C08G 18/7837; C08G 18/7887; C08G 18/423; C03F 7/001; G03F 7/035; G03F 7/0046; C08K 5/0016; G03H 1/02; G03H 2260/12; G03H 2001/0264; G11B 7/245
See application file for complete search history.

(56) References Cited

U.S. PATENT DOCUMENTS 5,470,813 A     11/1995  Le-Khac
5,679,710 A *   10/1997  Davy et al. .............. 514/547
(Continued)

FOREIGN PATENT DOCUMENTS

EP        134861    *  3/1985
EP        0223587 A1   5/1987
(Continued)

OTHER PUBLICATIONS

Wypych, Handbook of Plasticizers, Chapter 2, pp. 7-71 (2004).*
(Continued)

*Primary Examiner* — Martin Angebranndt
(74) *Attorney, Agent, or Firm* — Drinker Biddle & Reath LLP

(57) ABSTRACT

The invention relates to a photopolymer formulation comprising matrix polymers, writing monomers, and photo initiators, comprising a combination of at least two different writing monomers. The invention further relates to the use of the photopolymer formulation for producing optical elements, in particular for producing holographic elements and images, to a method for producing the photopolymer formulation and to a method for illuminating holographic media made of the photopolymer formulation.

14 Claims, 2 Drawing Sheets

(51) Int. Cl.

| | | |
|---|---|---|
| *G03F 7/00* | (2006.01) | |
| *C08G 18/48* | (2006.01) | |
| *C08G 18/78* | (2006.01) | |
| *C08G 18/44* | (2006.01) | |
| *C08G 18/42* | (2006.01) | |
| *C08G 18/10* | (2006.01) | |
| *G03F 7/004* | (2006.01) | |
| *G11B 7/245* | (2006.01) | |
| *G11B 7/24044* | (2013.01) | |
| *G03F 7/035* | (2006.01) | |
| *C08K 5/00* | (2006.01) | |

(52) U.S. Cl.
CPC ............ *C08G 18/485* (2013.01); *G03F 7/035* (2013.01); *C08K 5/0016* (2013.01); *C08G 18/4825* (2013.01); *C08G 18/4854* (2013.01); *C08G 18/7831* (2013.01); *C08G 18/44* (2013.01); *C08G 18/4277* (2013.01); *C08G 18/10* (2013.01); *C08G 18/7837* (2013.01); *G03H 1/02* (2013.01); *G03H 2260/12* (2013.01); *C08G 18/7887* (2013.01); *G03F 7/0046* (2013.01); *G03H 2001/0264* (2013.01); *C08G 18/4238* (2013.01); *G11B 7/24044* (2013.01)
USPC ................ 430/1; 430/2; 430/280.1; 430/290; 359/3

(56) References Cited

U.S. PATENT DOCUMENTS

| | | | |
|---|---|---|---|
| 5,725,970 A * | 3/1998 | Martin et al. ................... 430/2 |
| 6,403,702 B1 * | 6/2002 | Markusch et al. ............ 524/590 |
| 6,627,354 B1 * | 9/2003 | Chandross et al. ............... 430/1 |
| 7,008,900 B1 | 3/2006 | Hofmann et al. |
| 8,222,314 B2 * | 7/2012 | Roelle et al. .................. 522/174 |
| 8,329,773 B2 * | 12/2012 | Facke et al. ..................... 522/97 |
| 8,361,678 B2 * | 1/2013 | Weiser et al. ..................... 430/1 |
| 2002/0142227 A1 * | 10/2002 | Dhar et al. ......................... 430/1 |
| 2004/0002008 A1 | 1/2004 | Hegel et al. |
| 2004/0179457 A1 | 9/2004 | Hirao et al. |
| 2004/0219457 A1 * | 11/2004 | Clabburn et al. ........... 430/280.1 |
| 2006/0128822 A1 * | 6/2006 | Katou et al. ....................... 522/7 |
| 2007/0070477 A1 * | 3/2007 | Eto et al. ......................... 359/12 |
| 2007/0172742 A1 * | 7/2007 | Yachi et al. ....................... 430/1 |
| 2008/0161444 A1 * | 7/2008 | Hayashi et al. .................. 522/81 |
| 2008/0312403 A1 * | 12/2008 | Stockel et al. ................... 528/59 |
| 2009/0087753 A1 * | 4/2009 | Satou et al. ....................... 430/2 |
| 2010/0036013 A1 | 2/2010 | Roelle et al. |
| 2010/0086860 A1 * | 4/2010 | Roelle et al. ....................... 430/2 |
| 2010/0086861 A1 * | 4/2010 | Weiser et al. ..................... 430/2 |
| 2010/0087564 A1 * | 4/2010 | Weiser et al. ................... 522/95 |
| 2010/0112459 A1 * | 5/2010 | Weiser et al. ..................... 430/2 |
| 2010/0112460 A1 * | 5/2010 | Satou et al. ....................... 430/2 |
| 2010/0203241 A1 * | 8/2010 | Weiser et al. ................. 427/162 |
| 2010/0247839 A1 * | 9/2010 | Hayashida et al. .......... 428/64.4 |
| 2011/0027697 A1 * | 2/2011 | Peredereeva et al. ............. 430/2 |
| 2011/0065827 A1 | 3/2011 | Facke et al. |
| 2011/0189591 A1 * | 8/2011 | Weiser et al. ..................... 430/2 |
| 2011/0207029 A1 * | 8/2011 | Hagen et al. ...................... 430/2 |
| 2011/0236803 A1 * | 9/2011 | Weiser et al. ..................... 430/2 |
| 2011/0311905 A1 * | 12/2011 | Honel et al. ...................... 430/2 |
| 2011/0311906 A1 * | 12/2011 | Rolle et al. ........................ 430/2 |
| 2012/0214089 A1 * | 8/2012 | Honel et al. ...................... 430/2 |
| 2012/0214090 A1 * | 8/2012 | Weiser et al. ..................... 430/2 |
| 2012/0214895 A1 * | 8/2012 | Rolle et al. ....................... 522/78 |
| 2012/0219883 A1 * | 8/2012 | Bruder et al. ..................... 430/2 |
| 2012/0219884 A1 * | 8/2012 | Weiser et al. ..................... 430/2 |
| 2012/0219885 A1 * | 8/2012 | Facke et al. ....................... 430/2 |
| 2012/0231376 A1 * | 9/2012 | Rolle et al. ........................ 430/2 |
| 2012/0237856 A1 * | 9/2012 | Rolle et al. ........................ 430/2 |
| 2012/0302659 A1 * | 11/2012 | Rolle et al. ..................... 522/173 |
| 2012/0321997 A1 * | 12/2012 | Rolle et al. ........................ 430/2 |
| 2012/0321998 A1 * | 12/2012 | Rolle et al. ........................ 430/2 |
| 2013/0224634 A1 * | 8/2013 | Berneth et al. ................... 430/2 |
| 2013/0252140 A1 * | 9/2013 | Facke et al. ....................... 430/2 |

FOREIGN PATENT DOCUMENTS

| | | | |
|---|---|---|---|
| EP | 684222 | * | 11/1995 |
| EP | 0700949 | A2 | 3/1996 |
| EP | 0743093 | A1 | 11/1996 |
| EP | 0761708 | A2 | 3/1997 |
| EP | 2110718 | * | 10/2009 |
| EP | 2154129 | A1 | 2/2010 |
| EP | 2219075 | A1 | 8/2010 |
| WO | WO 98/16310 | A1 | 4/1988 |
| WO | WO-97/40086 | A1 | 10/1997 |
| WO | WO-00/47649 | A1 | 8/2000 |
| WO | 2008123303 | * | 10/2008 |
| WO | WO-2008/125229 | A1 | 10/2008 |
| WO | WO-2008125201 | A1 | 10/2008 |

OTHER PUBLICATIONS

Kogelnik, H., *Coupled Wave Theory for Thick Hologram Gratings* (1969), vol. 48, No. 9, The Bell System Technical Journal, pp. 2009-2947.

International Search Report for PCT/EP2010/066594 mailed Jan. 12, 2011.

* cited by examiner

PHOTOPOLYMER FORMULATION HAVING DIFFERENT WRITING COMONOMERS

CROSS-REFERENCE TO RELATED APPLICATIONS

This application is a national stage application (under 35 U.S.C. §371) of PCT/EP2010/066594, filed Nov. 2, 2010, which claims benefit of European application 09013769.6, filed Nov. 3, 2009, both of which are incorporated herein by reference in their entirety for all their useful purposes.

BACKGROUND

The invention relates to a photopolymer formulation comprising matrix polymers, writing monomers and photoinitiators. The invention furthermore relates to the use of the photopolymer formulation for the production of optical elements, in particular for the production of holographic elements and images, a process for the preparation of the photopolymer formulation and a process for exposing holographic media comprising the photopolymer formulation.

Photopolymer formulations of the type mentioned at the outset are known in the prior art. Thus, for example, WO 2008/125229 A1 describes a photopolymer formulation which contains polyurethane-based matrix polymers, an acrylate-based writing monomer and photoinitiators. In the cured state, the writing monomer and the photoinitiators are embedded with spatially isotropic distribution in the polyurethane matrix. The WO document likewise discloses that further components, such as, for example, dibutyl phthalate, a classical plasticizer for industrial plastics, can be added to the photopolymer formulation.

For the uses of photopolymer formulations, the refractive index modulation $\Delta n$ produced by the holographic exposure in the photopolymer plays the decisive role. During the holographic exposure, the interference field of signal and reference light beam (in the simplest case, that of two plane waves) is mapped by the local photopolymerization of, for example, highly refractive acrylates at sites of high intensity in the interference field into a refractive index grating. The refractive index grating in the photopolymer (the hologram) contains all information of the signal light beam. By illumination of the hologram only with the reference light beam, the signal can then be reconstructed. The strength of the signal reconstructed in this manner in relation to the strength of the incident reference light is referred to as diffraction efficiency, or DE below. In the simplest case of a hologram which forms from the superposition of two plane waves, the DE is the quotient of the intensity of the light diffracted on reconstruction and the sum of the intensities of incident reference light and diffracted light. The higher the DE, the more efficient is a hologram with respect to the quantity of light of the reference light which is required for making the signal visible with a fixed brightness. Highly refractive acrylates are capable of producing diffraction index gratings having a high amplitude between regions with low refractive index and regions of high refractive index and hence of permitting holograms having a high DE and a high $\Delta n$ in photopolymer formulations. It should be noted that DE is dependent on the product of $\Delta n$ and the photopolymer layer thickness d. The greater the product, the greater is the possible DE (for reflection holograms). The width of the angle range in which the hologram is visible (reconstructed), for example on monochromatic illumination, depends only on the layer thickness d. On illumination of the hologram with, for example, white light, the width of the spectral range which contributes to the reconstruction of the hologram may likewise be dependent only on the layer thickness d. The smaller d, the greater are the respective acceptance widths. If it is therefore intended to produce bright and readily visible holograms, a high $\Delta n$ and a small thickness d are desirable, in particular so that DE is as large as possible. This means that the higher $\Delta n$, the more latitude is achieved in configuring the layer thickness d for bright holograms without loss of DE. The optimization of $\Delta n$ is therefore of outstanding importance in the optimization of photopolymer formulations (P. Hariharan, Optical Holography, 2nd Edition, Cambridge University Press, 1996).

BRIEF DESCRIPTION OF EMBODIMENTS

It was an object of the present invention to provide a photopolymer formulation which, in comparison with the known formulations, permits the production of holograms having greater brightness (i.e. higher refractive index modulation $\Delta n$).

In the case of the photopolymer formulation according to the invention, this object is achieved if said formulation contains a combination of at least two different writing monomers. Here, "different" is to be understood as meaning that the writing monomers differ in their chemical structure and/or in their physical properties.

It was found that the use of a combination of two different writing monomers in the known photopolymer formulations leads to higher $\Delta n$ values in the case of the holograms produced therefrom than if an equivalent amount of only one writing monomer is used. In the end, this means that the holograms produced from the formulation according to the invention have greater brightness in comparison with the known holograms.

Mixtures of compounds such as acrylate-based $\alpha,\beta$-unsaturated carboxylic acid derivatives, such as acrylates, methacrylates, acrylamides, acrylonitrile, methacrylonitrile, methacrylamide, methacrylic acid, acrylic acid, can be used as writing comonomers essential to the invention. Acrylates and methacrylates are preferred.

BRIEF DESCRIPTION OF THE DRAWINGS

The foregoing brief description, as well as the following detailed description, may be better understood when read in conjunction with the appended drawings. For the purpose of assisting in the explanation of the invention, there are shown in the drawings representative embodiments which are considered illustrative. It should be understood, however, that the invention is not limited in any manner to the precise arrangements and instrumentalities shown.

In the drawings.

DETAILED DESCRIPTION OF EMBODIMENTS

Figure 1:
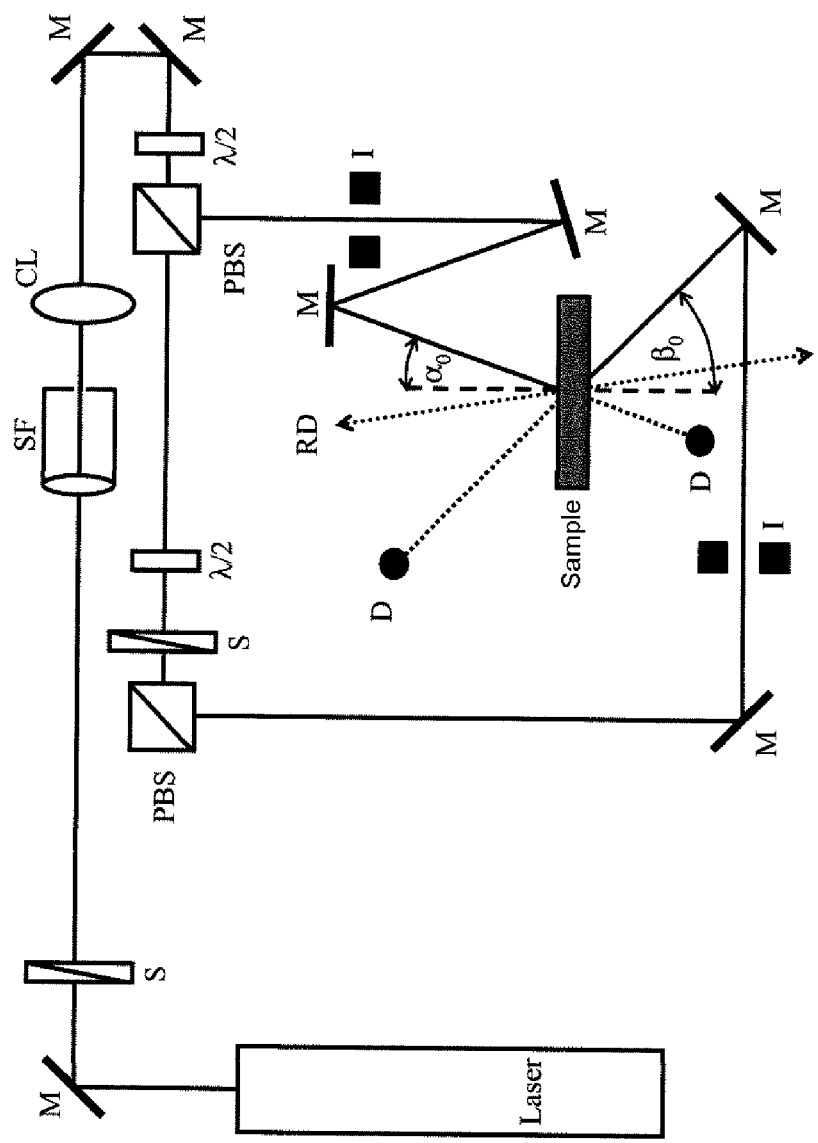
FIG. 1 illustrates a measuring arrangement for testing the holographic properties of the holographic media.

In general, esters of acrylic acid and methacrylic acid are designated as acrylates and methacrylates, respectively. Examples of acrylates and methacrylates which can be used are methyl acrylate, methyl methacrylate, ethyl acrylate, ethyl methacrylate, ethoxyethyl acrylate, ethoxyethyl methacrylate, n-butyl acrylate, n-butyl methacrylate, tert-butyl acrylate, tert-butyl methacrylate, hexyl acrylate, hexyl methacrylate, 2-ethylhexyl acrylate, 2-ethylhexyl methacrylate, butoxyethyl acrylate, butoxyethyl methacrylate, lauryl acrylate, lauryl methacrylate, isobornyl acrylate, isobornyl methacrylate, phenyl acrylate, phenyl methacrylate, p-chlorophenyl acrylate, p-chlorophenyl methacrylate, p-bromophenyl acrylate, p-bromophenyl methacrylate, 2,4,6-tri-chlorophenyl acrylate, 2,4,6-trichlorophenyl methacrylate, 2,4,6-tribromophenyl acrylate, 2,4,6-tri-bromophenyl methacrylate, pentachlorophenyl acrylate, pentachlorophenyl methacrylate, pentabromophenyl acrylate, pentabromophenyl methacrylate, pentabromobenzyl acrylate, pentabromobenzyl methacrylate, phenoxyethyl acrylate, phenoxyethyl methacrylate, phenoxyethoxyethyl acrylate, phenoxyethoxyethyl methacrylate, 2-naphthyl acrylate, 2-naphthyl methacrylate, 1,4-bis(2-thionaphthyl)-2-butyl acrylate, 1,4-bis(2-thionaphthyl)-2-butyl methacrylate, propane-2,2-diylbis[(2,6-dibromo-4,1-phenylene)oxy(2-{[3,3,3-tris(4-chlorophenyl)-propanoyl]oxy}propane-3,1-diyl)oxyethane-2,1-diyl] diacrylate, bisphenol A diacrylate, bisphenol A dimethacrylate, tetrabromobisphenol A diacrylate, tetrabromobisphenol A dimethacrylate and the ethoxylated analogue compounds thereof, N-carbazolyl acrylates, to mention only a selection.

Acrylate and methacrylates having a refractive index $n_D^{20}$ (measured at a wavelength of 405 nm) of greater than 1.45 are preferably used. Acrylates which contain at least one aromatic structural unit and have a refractive index $n_D^{20}$ (405 nm) of greater than 1.50 are particularly preferably used. Acrylates and methacrylates based on bisphenol A or derivatives thereof may be mentioned as particularly suitable examples for this purpose, as well as those acrylates and methacrylates which contain a thioaryl group.

Urethane acrylates may also be used as writing comonomers. Urethane acrylates are understood as meaning compounds having at least one acrylic acid ester group which additionally have at least one urethane bond. It is known that such compounds can be obtained by reacting a hydroxy-functional acrylic acid ester with an isocyanate-functional compound.

Examples of isocyanates which can be used for this purpose are aromatic, araliphatic, aliphatic and cycloaliphatic di-, tri- or polyisocyanates. It is also possible to use mixtures such as di-, tri- or poly-isocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis (4,4'-isocyanatocyclohexyl)methanes and mixtures thereof having any desired isomer content, isocyanatomethyl-1,8-octane diisocyanate, 1,4-cyclohexylene diisocyanate, the isomeric cyclo-hexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, 1,5-naphthylene diisocyanate, triphenylmethane 4,4',4"-triisocyanate and tris(p-isocyanatophenyl) thiophosphate or derivatives thereof having a urethane, urea, carbodiimide, acylurea, isocyanurate, allophanate, biuret, oxadiazinetrione, uretdione or iminooxadiazinedione structure and mixtures thereof. Aromatic or araliphatic di-, tri- or polyisocyanates are preferred.

Suitable hydroxy-functional acrylates or methacrylates for the preparation of urethane acrylates are compounds such as 2-hydroxyethyl (meth)acrylate, polyethylene oxide mono (meth)acrylates, polypropylene oxide mono(meth)acrylates, polyalkylene oxide mono(meth)acrylates, poly(ε-caprolactone) mono(meth)acrylates, such as, for example, Tone® M100 (Dow, Schwalbach, Germany), 2-hydroxypropyl (meth)acrylate, 4-hydroxybutyl (meth)acrylate, 3-hydroxy-2,2-dimethylpropyl (meth)acrylate, hydroxypropyl (meth) acrylate, 2-hydroxy-3-phenoxypropyl acrylate, the hydroxy-functional mono-, di- or tetraacrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol or industrial mixtures thereof. 2-Hydroxyethyl acrylate, hydroxypropyl acrylate, 4-hydroxybutyl acrylate and poly(ε-caprolactone) mono(meth)acrylates are preferred. In addition, isocyanate-reactive oligomeric or polymeric unsaturated compounds containing acrylate and/or methacrylate groups, alone or in combination with the abovementioned monomeric compounds, are suitable. The epoxy (meth)acrylates known per se, containing hydroxyl groups and having OH contents of 20 to 300 mg KOH/g or polyurethane (meth) acrylates containing hydroxyl groups and having OH contents of 20 to 300 mg KOH/g or acrylated polyacrylates having OH contents of 20 to 300 mg KOH/g and mixtures thereof with one another and mixtures with unsaturated polyesters containing hydroxyl groups and mixtures with polyester (meth)acrylates or mixtures of unsaturated polyesters containing hydroxyl groups with polyester (meth)acrylates can likewise be used. Epoxy acrylates containing hydroxyl groups and having a defined hydroxy functionality are preferred. Epoxy (meth)acrylates containing hydroxyl groups are based in particular on reaction products of acrylic acid and/or methacrylic acid with epoxides (glycidyl compounds) of monomeric, oligomeric or polymeric bisphenol A, bisphenol F, hexanediol and/or butanediol or the ethoxylated and/or propoxylated derivatives thereof. Epoxy acrylates having a defined functionality, as can be obtained from the known reaction of acrylic acid and/or methacrylic acid and glycidyl (meth)acrylate, are furthermore preferred.

Mixtures of (meth-)acrylates and/or urethane (meth)acrylates are preferably used, particularly preferably of (meth) acrylates and/or urethane (meth)acrylates which have at least one aromatic structural unit.

Particularly preferred compounds to be used as writing comonomers are mixtures of urethane acrylates and urethane methacrylates based on aromatic isocyanates and 2-hydroxyethyl acrylate, hydroxypropyl acrylate, 4-hydroxybutyl acrylate, polyethylene oxide mono(meth)acrylate, polypropylene oxide mono(meth)acrylate, polyalkylene oxide mono(meth) acrylate and poly(ε-caprolactone) mono(meth)acrylates.

In a very particularly preferred embodiment, the mixtures of adducts of aromatic triisocyanates (very particularly preferably tris(4-phenylisocyanato)thiophosphate or trimers of aromatic diisocyanates, such as toluene diisocyanate) with hydroxyethyl acrylate, hydroxypropyl acrylate, 4-hydroxybutyl acrylate, together with the adducts of 3-thiomethylphenyl isocyanate with hydroxyethyl acrylate, hydroxypropyl acrylate, 4-hydroxybutyl acrylate, are used as writing comonomers (as described in the applications WO 2008/125229 A1 and in the non prior published application EP 09009651.2).

Furthermore, the use of glycidyl ether acrylate urethanes as writing monomers is preferred. These obey the general formula Ia or Ib or mixtures of Ia and Ib

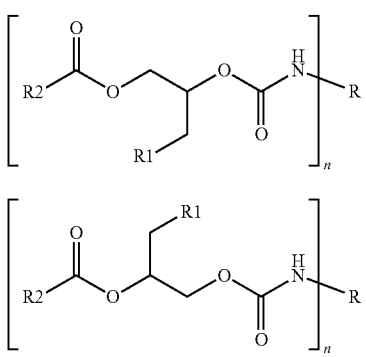

formula Ia formula Ib in which n is a natural number from 2 to 6,

R1 is a mono- or polynuclear organic radical containing aromatic groups and having 4 to 36 carbon atoms, R2 is an olefinically unsaturated radical having 3 to 30 carbon atoms and R is an organic radical derived from an aliphatic or aromatic di- or polyisocyanate and having to 2 to 30 carbon atoms.

The unsaturated glycidyl ether acrylate urethanes of the formula Ia or Ib can be prepared in a 2-stage synthesis. In the first reaction, an unsaturated carboxylic acid is reacted with an epoxide, a mixture of two alcohols being formed. Of course, unsaturated epoxides can also be reacted with any desired carboxylic acids in this reaction step to give the analogous intermediate. In a second reaction step this alcohol mixture is urethanized by means of a di- or polyisocyanate $R(NCO)_n$ of functionality n to give the glycidyl ether acrylate urethane (as described in the non prior published application EP 09002180.9). Methacrylic acid and acrylic acid or derivatives thereof or aromatic carboxylic acids are preferably used for the reaction with an unsaturated epoxide, aromatic or unsaturated epoxides, such as phenyl, dibromophenyl, naphthyl or biphenyl glycidyl ether or glycidyl (meth)acrylate, are preferably used as epoxides and toluene diisocyanate (TDI), hexamethylene diisocyanate (HDI) or triisocyanatononane (TIN) is preferably used as the isocyanate component.

In a very particularly preferred embodiment, the combinations of (acrylic acid, biphenyl glycidyl ether and TDI), (acrylic acid, phenyl glycidyl ether and TDI) and (acrylic acid, biphenyl glycidyl ether and HDI) are used.

According to a preferred embodiment, it is intended that the writing monomers differ in their respective refractive indices $n_D^{20}$ (405 nm) by not more than 0.200, preferably not more than 0.100 and in particular not more than 0.065 have in each case a refractive index $n_D^{20}$ (405 nm) of ≥1.45, preferably of ≥1.50 and particularly preferably of ≥1.55. With photopolymer formulations which contain such a writing monomer combination, particular high Δn values can be achieved.

It is furthermore preferred if the writing monomers are acrylates, preferably urethane acrylates, it being possible in particular for the acrylates to be mono-, di-, tri and/or polyfunctional. In the context of the invention, mono-, di-, tri- and/or polyfunctional is to be understood as meaning in each case the number of acrylate groups per molecule, i.e. a monofunctional writing monomer has one acrylate group, a difunctional writing monomer has two acrylate groups, a trifunctional writing monomer has three acrylate groups and a polyfunctional writing monomer has more than 3 acrylate groups.

It is particularly preferred if the photopolymer formulation contains a combination of a monofunctional and a polyfunctional, in particular difunctional- or trifunctional, urethane acrylate. It is likewise advantageous if the combination of a difunctional and a trifunctional writing monomer is used. The holograms produced from such photopolymer formulations have particular high Δn values.

The matrix polymers can preferably be polyurethanes, which are obtainable in particular by reacting an isocyanate component a) with an isocyanate-reactive component b).

Photopolymer formulations comprising matrix polymers obtainable by reacting a polyisocyanate component a) with an isocyanate-reactive component b), at least 2 two different compounds which have groups reacting under the action of actinic radiation with ethylenically unsaturated compounds with polymerization (radiation-curing groups) and are themselves free of NCO groups, as writing monomers c), free radical stabilizers d), photoinitiators e), optionally catalysts f) and optionally auxiliaries and additives g) are furthermore preferred.

The isocyanate component a) preferably comprises polyisocyanates. Polyisocyanates which may be used are all compounds known per se to the person skilled in the art or mixtures thereof which have on average two or more NCO functions per molecule. These may be aromatic, araliphatic, aliphatic or cycloaliphatic. In minor amounts, it is also possible concomitantly to use monoisocyanates and/or polyisocyanates comprising unsaturated groups.

For example, butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate, the isomeric bis(4,4'-isocyanatocyclohexyl)methane and mixtures thereof having any desired isomer content, isocyanatomethyl-1,8-octane diisocyanate, 1,4-cyclohexylene diisocyanate, the isomeric cyclohexane dimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate and/or triphenylmethane 4,4',4"-triisocyanate are suitable.

Also suitable is the use of derivatives of monomeric di- or triisocyanates having urethane, urea, carbodiimide, acylurea, isocyanurate, allophanate, biuret, oxadiazinetrione, uretdione and/or iminooxadiazinedione structures.

The use of polyisocyanates based on aliphatic and/or cycloaliphatic di- or triisocyanates is preferred.

The polyisocyanates of component a) are particularly preferably dimerized or oligomerized aliphatic and/or cycloaliphatic di- or triisocyanates.

Isocyanurates, uretdiones and/or iminooxadiazinediones based on HDI and 1,8-diisocyanato-4-(isocyanatomethyl)octane or mixtures thereof are very particularly preferred.

NCO functional prepolymers having urethane, allophanate, biuret and/or amide groups can also be used as component a). Prepolymers of component a) are obtained in a manner well known per se to the person skilled in the art by reacting mono-, oligo- or polyisocyanates a1) with isocyanate-reactive compounds a2) in suitable stoichiometry with optional use of catalysts and solvents.

Suitable polyisocyanates a1) are all aliphatic, cycloaliphatic, aromatic or araliphatic di- and triisocyanates known per se to the person skilled in the art, it being unimportant whether these were obtained by means of phosgenation or by phosgene-free processes. In addition, the higher molecular weight secondary products of monomeric di- and/or triisocyanates well known per se to those skilled in the art and having a urethane, urea, carbodiimide, acylurea, isocyanurate, allophanate, biuret, oxadiazinetrione, uretdione or iminooxadiazinedione structure can also be used, individually or in any desired mixtures with one another.

Examples of suitable monomeric di- or triisocyanates which can be used as component a1) are butylene diisocyanate, hexamethylene diisocyanate (HDI), isophorone diisocyanate (IPDI), trimethylhexamethylene diisocyanate (TMDI), 1,8-diisocyanato-4-(isocyanatomethyl)octane, isocyanatomethyl-1,8-octane diisocyanate (TIN), 2,4- and/or 2,6-toluene diisocyanate.

OH-functional compounds are preferably used as isocyanate-reactive compounds a2) with a synthesis of the prepolymers. These are analogous to the OH-functional compounds, as described below for component b).

Preferred OH-functional compounds in a2) are polyesterpolyols and/or polyetherpolyols having number average molar masses of 200 to 6200 g/mol. Difunctional polyetherpolyols based on ethylene glycol and propylene glycol, the proportion of propylene glycol accounted for at least 40% by weight, and polymers of tetrahydrofuran having number average molar masses of 200 to 4100 g/mol and aliphatic polyesterpolyols having number average molar masses of 200 to 3100 g/mol are particularly preferred.

Difunctional polyetherpolyols based on ethylene glycol and propylene glycol, the proportion of propylene glycol accounting for at least 80% by weight (in particular pure polypropylene glycols), and polymers of tetrahydrofuran having number average molar masses of 200 to 2100 g/mol are very particularly preferred. Adducts of butyrolactone, ε-caprolactone and/or methyl-ε-caprolactone (in particular ε-caprolactone) with aliphatic, araliphatic or cycloaliphatic di-, tri- or polyfunctional alcohols containing 2 to 20 carbon atoms (in particular with difunctional aliphatic alcohols having 3 to 12 carbon atoms) are also very particularly preferred. These adducts preferably have number average molar masses of 200 to 2000 g/mol, particularly preferably of 500 to 1400 g/mol.

Allophanates can also be used as a mixture with other prepolymers or oligomers of component a1). In these cases, the use of OH-functional compounds having functionalities of 1 to 3.1 is advantageous. The use of monofunctional alcohols, those having 3 to 20 carbon atoms are preferred.

The use of the amines for prepolymer preparation is also possible. For example, ethylenediamine, diethylenetriamine, triethylenetetramine, propylenediamine, diaminocyclohexane, diaminobenzene, diaminobisphenyl, difunctional polyamines, such as, for example, the Jeffamine®, amine-terminated polymers having number average molar masses of 10 000 g/mol and any desired mixtures thereof with one another are suitable.

For the preparation of prepolymers containing biuret groups, isocyanate is reacted in excess with amine, a biuret group forming All oligomeric or polymeric, primary or secondary, difunctional amines of the abovementioned type are suitable as amines in this case for the reaction than the di-, tri- and polyisocyanates mentioned. Aliphatic biurets based on aliphatic amines and aliphatic isocyanates are preferred. Low molecular weight biurets having number average molar masses of less than 2000 g/mol, based aliphatic diamines or difunctional polyamines and aliphatic diisocyanates, in particular HDI and TMDI, are preferred.

Preferred prepolymers are urethanes, allophanates or biurets obtained from aliphatic isocyanate-functional compounds and oligomeric or polymeric isocyanate-reactive compounds having number average molar masses of 200 to 10 000 g/mol; urethanes, allophanates or biurets obtained from aliphatic isocyanate-functional compounds and polyols having number average molar masses of 200 to 6200 g/mol or (poly)amines having number average molar masses of 3000 g/mol are particularly preferred and allophanates obtained from HDI or TMDI and difunctional polyetherpolyols (in particular polypropylene glycols) having number average molar masses of 200 to 2100 g/mol, urethanes obtained from HDI or TMDI and based on adducts of butyrolactone, ε-caprolactone and/or methyl-ε-caprolactone (in particular ε-caprolactone) with aliphatic, araliphatic or cycloaliphatic di-, tri- or polyfunctional alcohols containing 2 to 20 carbon atoms (in particular with difunctional aliphatic alcohols having 3 to 12 carbon atoms), having number average molar masses of 500 to 3000 g/mol, particularly preferably of 1000 to 2000 g/mol (in particular as a mixture with other oligomers of difunctional aliphatic isocyanates) or urethanes obtained from HDI or TMDI and based on trifunctional polyetherpolyols (in particular polypropylene glycol) having number average molar masses between 2000 and 6200 g/mol and biurets obtained from HDI or TMDI with difunctional amines or polyamines having number average molar masses of 200 to 1400 g/mol (in particular also as a mixture with other oligomers of difunctional aliphatic isocyanates) are very particularly preferred.

The prepolymers described above preferably have residual contents of free monomeric isocyanate of less than 2% by weight, particularly preferably less than 1.0% by weight, very particularly preferably less than 0.5% by weight.

In addition to the prepolymers described, the isocyanate component can of course contain further isocyanate components proportionately. Aromatic, araliphatic, aliphatic and cycloaliphatic di-, tri- or polyisocyanates are suitable for this purpose. It is also possible to use mixtures of such di-, tri- or polyisocyanates. Examples of suitable di-, tri- or polyisocyanates are butylene diisocyanate, hexamethylene diisocyanate (HDI), isophorone diisocyanate (IPDI), 1,8-diisocyanato-4-(isocyanatomethyl)octane, 2,2,4- and/or 2,4,4-trimethylhexamethylene diisocyanate (TMDI), the isomeric bis(4,4'-isocyanatocyclohexyl)methanes and mixtures thereof having any desired isomer content, isocyanatomethyl-1,8-octane diisocyanate, 1,4-cyclohexylene diisocyanate, the isomeric cyclohexanedimethylene diisocyanates, 1,4-phenylene diisocyanate, 2,4- and/or 2,6-toluene diisocyanate, 1,5-naphthylene diisocyanate, 2,4'- or 4,4'-diphenylmethane diisocyanate, triphenylmethane 4,4',4''-triisocyanate or derivatives thereof having a urethane, urea, carbodiimide, acylurea, isocyanurate, allophanate, biuret, oxadiazinetrione, uretdione or iminooxadiazinedione structure and mixtures thereof. Polyisocyanates based on oligomerized and/or derivatized diisocyanates which were freed from excess diisocyanate by suitable processes are preferred, in particular those of hexamethylene diisocyanate. The oligomeric isocyanurates, uretdiones and iminooxadiazinediones of HDI and mixtures thereof are particularly preferred.

It is optionally also possible for the isocyanate component a) proportionately to contain isocyanates, which are partially reacted with isocyanate-reactive ethylenically unsaturated compounds. α,β-Unsaturated carboxylic acid derivatives, such as acrylates, methacrylates, maleates, fumarates, maleimides, acrylamides, and vinyl ethers, propenyl ethers, allyl ethers and compounds which contain dicyclopentadienyl units and have at least one group reactive towards isocyanate are preferably used here as isocyanate-reactive ethylenically unsaturated compounds; these are particular for the acrylates and methacrylates having at least one isocyanate-reactive group. Suitable hydroxy-functional acrylates or methacrylates are, for example, compounds such as 2-hydroxyethyl (meth)acrylate, polyethylene oxide mono(meth)acrylates, polypropylene oxide mono(meth)acrylates, polyalkylene oxide mono(meth)acrylates, poly(ε-caprolactone) mono(meth)-acrylates, such as, for example, Tone® M100 (Dow, USA), 2-hydroxypropyl (meth)acrylate, 4-hydroxybutyl (meth)acrylate, 3-hydroxy-2,2-dimethylpropyl (meth)acrylate, the hydroxy-functional mono-, di- or tetra(meth)acrylates of polyhydric alcohols, such as trimethylolpropane, glycerol, pentaerythritol, dipentaerythritol, ethoxylated, propoxylated or alkoxylated trimethylolpropane, glycerol, pentaerythritol, dipentaerythritol and industrial mixtures thereof. In addition, isocyanate-reactive oligomeric or polymeric unsaturated compounds containing acrylate and/or methacrylate groups, alone or in combination with the abovementioned monomeric compounds, are suitable. The proportion of isocyanates which are partly reacted with isocyanate-reactive ethylenically unsaturated compounds, based on the isocyanate component a), is 0 to 99%, preferably 0 to 50%, particularly preferably 0 to 25% and very particularly preferably 0 to 15%.

It is optionally also possible with the abovementioned isocyanate component a) to contain, completely or proportionately, isocyanates which reacted completely or partly with blocking agents known to the person skilled in the art from coating technology. The following may be mentioned as an example of blocking agents: alcohols, lactams, oximes, malonic esters, alkyl acetoacetates, triazoles, phenols, imidazoles, pyrazoles and amines, such as, for example, butanone oxime, diisopropylamine, 1,2,4-triazole, dimethyl-1,2,4-triazole, imidazole, diethyl malonate, ethyl acetoacetate, acetone oxime, 3,5-dimethylpyrazole, ε-caprolactam, N-tert-butylbenzylamine, cyclopentanone carboxyethyl ester or any desired mixtures of these blocking agents.

In principle, all polyfunctional, isocyanate-reactive compounds which have on average at least 1.5 isocyanate-reactive groups per molecule can be used as component b).

In the context of the present invention, isocyanate-reactive groups are preferably hydroxyl, amino or thio groups, and hydroxy compounds are particularly preferred.

Suitable polyfunctional, isocyanate-reactive compounds are, for example, polyester-, polyether-, polycarbonate-, poly(meth)acrylate- and/or polyurethanepolyols.

In addition, aliphatic, araliphatic or cycloaliphatic di, tri or polyfunctional alcohols having a low molecular weight, i.e. having molecular weights of less than 500 g/mol and a short chain, i.e. containing 2 to 20 carbon atoms, are also suitable as polyfunctional, isocyanate-reactive compounds as constituents of component b).

These may be, for example, ethylene glycol, diethylene glycol, triethylene glycol, tetraethylene glycol, dipropylene glycol, tripropylene glycol, 1,2-propanediol, 1,3-propanediol, 1,4-butanediol, neopentyl glycol, 2-ethyl-2-butylpropanediol, trimethylpentanediol, positional isomers of diethyloctanediol, 1,3-butylene glycol, cyclohexanediol, 1,4-cyclohexanedimethanol, 1,6-hexanediol, 1,2- and 1,4-cyclohexanediol, hydrogenated bisphenol A (2,2-bis(4-hydroxycyclo-hexyl)propane), 2,2-dimethyl-3-hydroxypropionic acid (2,2-dimethyl-3-hydroxypropyl ester). Examples of suitable triols are trimethylolethane, trimethylolpropane or glycerol. Suitable higher-functional alcohols are ditrimethylolpropane, pentaerythritol, dipentaerythritol or sorbitol.

Suitable polyesterpolyols are, for example, linear polyesterdiols or branched polyesterpolyols, as are obtained in a known manner from aliphatic, cycloaliphatic or aromatic di- or polycarboxylic acids or their anhydrides with polyhydric alcohols having a OH-functionality of ≥2.

Examples of such di- or polycarboxylic acids or anhydrides are succinic, glutaric, adipic, pimelic, suberic, azelaic, sebacic, nonanedicarboxylic, decanedicarboxylic, terephthalic, isophthalic, o-phthalic, tetrahydrophthalic, hexahydrophthalic or trimellitic acid and acid anhydrides, such as o-phthalic, trimellitic or succinic anhydride or any desired mixtures thereof with one another.

Examples of such suitable alcohols are ethanediol, di-, tri- or tetraethylene glycol, 1,2-propanediol, di-, tri- or tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol, trimethylolpropane, glycerol or any desired mixtures thereof with one another.

Preferred polyesterpolyols are based on aliphatic alcohols and mixtures of aliphatic and aromatic acids and have number average molar masses between 500 and 10 000 g/mol and functionalities between 1.8 and 6.1.

Particularly preferred polyesterpolyols are based on aliphatic diols, such as butane-1,4-diol, hexane-1,6-diol, neopentyl glycol, ethanediol, propylene glycol, 1,3-butylene glycol, di-, tri- or polyethylene glycol, di-, tri- and/or tetrapropylene glycol or mixtures of abovementioned diols with aliphatic alcohols having a higher functionality, such as trimethylolpropane and/or pentaerythritol, the proportion of the alcohols having a higher functionality preferably accounting for less than 50 percent by weight (particularly less than 30 percent by weight), based on the total amount of the alcohol used, in combination with aliphatic di- or polycarboxylic acids or anhydrides, such as adipic acid and/or succinic acid or mixtures of abovementioned aliphatic polycarboxylic acids or anhydrides with aromatic polycarboxylic acids or anhydrides, such as terephthalic acid and/or isophthalic acid, the proportion of the aromatic polycarboxylic acids or anhydrides preferably accounting for less than 50 percent by weight (particularly less than 30 percent by weight), based on the total amount of the polycarboxylic acids or anhydrides used. Particularly preferred polyesterpolyols have number average molar masses between 1000 and 6000 g/mol and functionalities between 1.9 and 3.3.

The polyesterpolyols may also be based on natural raw materials, such as castor oil. It is also possible for the polyesterpolyols to be based on homo- or copolymers of lactones, as can preferably be obtained by an additional reaction of lactones or lactone mixtures in a ring-opening lactone polymerization, such as butyrolactone, ε-caprolactone and/or methyl-ε-caprolactone, with hydroxy-functional compounds, such as polyhydric alcohols having an OH-functionality of ≥2 or polyols having a functionality of greater than 1.8, for example of the abovementioned type.

Preferred polyols which are used here as starters are polyetherpolyols having a functionality of 1.8 to 3.1 with number average molar masses of 200 to 4000 g/mol; poly(tetrahydrofurans) having a functionality of 1.9 to 2.2 and number average molar masses of 500 to 2000 g/mol (in particular 600 to 1400 g/mol) are particularly preferred. Adducts of butyrolactone, ε-caprolactone and/or methyl-ε-caprolactone and ε-caprolactone is particularly preferred.

Such polyesterpolyols preferably have number average molar masses of 400 to 6000 g/mol, particularly preferably of 800 to 3000 g/mol. Their OH functionality is preferably 1.8 to 3.5, particularly preferably 1.9 to 2.2.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned in connection with the polyester segments and having an OH functionality of ≥2, preferably 1,4-butanediol, 1,6-hexanediol and/or 3-methylpentanediol, or polyesterpolyols can be converted into polycarbonatepolyols.

Such polycarbonatepolyols preferably have number average molar masses of 400 to 4000 g/mol, particularly preferably of 500 to 2000 g/mol. The OH functionality of these polyols is preferably 1.8 to 3.2, particularly preferably 1.9 to 3.0.

Suitable polyetherpolyols are polyadducts of cyclic ethers with OH- or NH-functional starter molecules, said polyadducts optionally having a block structure.

Suitable cyclic ethers are, for example, styrene oxides, ethylene oxide, propylene oxide, tetrahydrofuran, butylene oxide, epichlorohydrin and any desired mixtures thereof.

Starters which may be used are the polyhydric alcohols mentioned in connection with the polyesterpolyols and having an OH functionality of ≥2 and primary or secondary amines and amino alcohols.

Preferred polyetherpolyols are those of the abovementioned type, exclusively based on propylene oxide or random or block copolymers based on propylene oxide with further 1-alkylene oxides, the proportion of 1-alkylene oxides being not higher than 80% by weight. Propylene oxide homopolymers and random or block copolymers which have oxyethylene, oxypropylene and/or oxybutylene units are particularly preferred, the proportion of the oxypropylene units, based on the total amount of all oxyethylene, oxypropylene and oxybutylene units, accounting for at least 20% by weight, preferably at least 45% by weight. Here, oxypropylene and oxybutylene comprise all respective linear and branched C3- and C4-isomers.

Such polyetherpolyols preferably have number average molar masses of 250 to 10 000 g/mol, particularly preferably of 500 to 8500 g/mol and very particularly preferably of 600 to 4500 g/mol. The OH functionality is preferably 1.5 to 4.0, particularly preferably 1.8 to 3.1 and very particularly preferably 1.9 to 2.2.

Special polyetherpolyols which are preferably used are those which consist of an isocyanate-reactive component comprising hydroxy-functional multiblock copolymers of the Y(Xi-H)n type with i=1 to 10 and n=2 to 8 and number average molecular weights greater than 1500 g/mol, the Xi segments being composed in each case of oxyalkylene units of the formula II

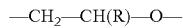   formula II in which R is a hydrogen, alkyl or aryl radical which may also be substituted or may be interrupted by heteroatoms (such as ether oxygens), Y is a starter forming the basis, and the proportion of the Xi segments, based on the total amount of the Xi and Y segments, accounts for at least 50% by weight.

The outer blocks $X_i$ account for at least 50% by weight, preferably 66% by weight, of the total molar mass of $Y(X_i—H)_n$ and consist of monomer units which obey the formula II. In $Y(X_i—H)_n$, n is preferably a number from 2 to 6, particularly preferably 2 or 3 and very particularly preferably 2. In $Y(X_i—H)_n$, i is preferably a number from 1 to 6, particularly preferably from 1 to 3 and very particularly preferably 1.

In formula II, R is preferably a hydrogen, a methyl, butyl, hexyl or octyl group or an alkyl radical containing ether groups. Preferred alkyl radicals containing ether groups are those based on oxyalkylene units.

The multiblock copolymers $Y(X_i—H)_n$ preferably have number average molecular weights of more than 1200 g/mol, particularly preferably more than 1950 g/mol, but preferably not more than 12 000 g/mol, particularly preferably not more than 8000 g/mol.

The $X_i$ blocks may comprise exclusively identical oxyalkylene repeating units. They may also be composed randomly of different oxyalkylene units or in turn be composed of different oxyalkylene units in a block structure.

Preferably, the $X_i$ segments are based exclusively on propylene oxide or random or blockwise mixtures of propylene oxide with further 1-alkylene oxides, the proportion of further 1-alkylene oxides being not higher than 80% by weight.

Particularly preferred segments $X_i$ are propylene oxide homopolymers and random or block copolymers which contain oxyethylene and/or oxypropylene units, the proportion of the oxypropylene units, based on a total amount of all oxyethylene and oxypropylene units, accounting for at least 20% by weight, particularly preferably 40% by weight.

As described further below, the $X_i$ blocks are added to an n-fold hydroxy- or amino-functional starter block $Y(H)_n$ by ring-opening polymerization of the alkylene oxides described above.

The inner block Y, which is present in an amount of less than 50% by weight, preferably less than 34% by weight, in $Y(X_i—H)_n$, consists of dihydroxy-functional polymer structures and/or polymer structures having a higher hydroxy-functionality, based on cyclic ethers, or is composed of dihydroxy-functional polycarbonate, polyester, poly(meth)acrylate, epoxy resin and/or polyurethane structural units and/or said structural units having a higher hydroxy functionality or corresponding hybrids.

Suitable polyesterpolyols are linear polyesterdiols or branched polyesterpolyols, as can be prepared in a known manner from aliphatic, cycloaliphatic or aromatic di- or polycarboxylic acids or their anhydrides, such as, for example, succinic, glutaric, adipic, pimelic, suberic, azelaic, sebacic, nonanedicarboxylic, decandicarboxylic, terephthalic, isophthalic, o-phthalic, tetrahydrophthalic, hexahydrophthalic or trimellitic acid and acid anhydrides, such as o-phthalic, trimellitic or succinic anhydride, or any desired mixtures thereof with polyhydric alcohols, such as, for example, ethanediol, di-, tri- or tetraethylene glycol, 1,2-propanediol, di-, tri-, tetrapropylene glycol, 1,3-propanediol, 1,4-butanediol, 1,3-butanediol, 2,3-butanediol, 1,5-pentanediol, 1,6-hexanediol, 2,2-dimethyl-1,3-propanediol, 1,4-dihydroxycyclohexane, 1,4-dimethylolcyclohexane, 1,8-octanediol, 1,10-decanediol, 1,12-dodecanediol or mixtures thereof, optionally with concomitant use of polyols having a higher functionality, such as trimethylolpropane or. Suitable polyhydric alcohols for the preparation of the polyesterpolyols are of course also cycloaliphatic and/or aromatic di- and polyhydroxy compounds. Instead of the free polycarboxylic acid, it is also possible to use the corresponding polycarboxylic anhydrides or corresponding polycarboxylic esters of lower alcohols or mixtures thereof for the preparation of the polyesters.

The polyesterpolyols may also be based on natural raw materials, such as castor oil. It is also possible for the polyesterpolyols to be based on homo- or copolymers of lactones, as can preferably be obtained by an addition reaction of lactones or lactone mixtures such as butyrolactone, ε-caprolactone and/or methyl-ε-caprolactone, with hydroxy-functional compounds, such as polyhydric alcohols having an OH functionality of preferably 2, for example of the abovementioned type.

Such polyesterpolyols preferably have number average molar masses of 200 to 2000 g/mol, particularly preferably of 400 to 1400 g/mol.

Suitable polycarbonatepolyols are obtainable in a manner known per se by reacting organic carbonates or phosgene with diols or diol mixtures.

Suitable organic carbonates are dimethyl, diethyl and diphenyl carbonate.

Suitable diols or mixtures comprise the polyhydric alcohols mentioned per se in connection with the polyesterpolyols and having an OH functionality of 2, preferably 1,4-butanediol, 1,6-hexanediol and/or 3-methylpentanediol. Polyesterpolyols may also be converted into polycarbonatepolyols. Dimethyl or diethyl carbonate are particularly preferably used in the reaction of said alcohols to give polycarbonatepolyols.

Such polycarbonatepolyols preferably have number average molar masses of 400 to 2000 g/mol, particularly preferably of 500 to 1400 g/mol and very particularly preferably of 650 to 1000 g/mol.

Suitable polyetherpolyols are optionally polyadducts of cyclic ethers with OH- or NH-functional starter molecules, which polyadducts optionally have a block structure. For example, the polyadducts of styrene oxides, of ethylene oxide, propylene oxide, tetrahydrofuran, butylene oxide, epichlorohydrin, and their mixed adducts and graft products, and the polyetherpolyols obtained by condensation of polyhydric alcohols or mixtures thereof and the polyetherpolyols obtained by alkoxylation of polyhydric alcohols, amines and amino alcohols, may be mentioned as polyetherpolyols.

Suitable polymers of cyclic ethers are in particular polymers of tetrahydrofuran.

The polyhydric alcohols mentioned per se in connection with the polyesterpolyols, and primary or secondary amines and amino alcohols having an OH or NH functionality of 2 to 8, preferably 2 to 6, particularly preferably 2 to 3, very particularly preferably 2, may be used as starters.

Such polyetherpolyols preferably have number average molar masses of 200 to 2000 g/mol, particularly preferably of 400 to 1400 g/mol and very particularly preferably of 650 to 1000 g/mol.

The polymers of tetrahydrofuran are preferably employed as polyetherpolyols used for starters.

Of course, mixtures of the components described above can also be used for the inner block Y.

Preferred components for the inner block Y are polymers of tetrahydrofuran and aliphatic polycarbonatepolyols and polyesterpolyols and polymers of ε-caprolactone having number average molar masses of less than 3100 g/mol.

Particularly preferred components for the inner block Y are difunctional polymers of tetrahydrofuran and difunctional aliphatic polycarbonatepolyols and polyesterpolyols and polymers of ε-caprolactone having number average molar masses of less than 3100 g/mol.

Very particularly preferably, the starter segment Y is based on difunctional, aliphatic polycarbonatepolyols, poly(ε-caprolactone) or polymers of tetrahydrofuran having number average molar masses greater than 500 g/mol and less than 2100 g/mol.

Preferably used block copolymers of the structure $Y(X_i-H)_n$ comprise more than 50 percent by weight of the $X_i$ blocks described above and have a number average total molar mass of greater than 1200 g/mol.

Particularly preferred block copolyols consist of less than 50 percent by weight of aliphatic polyester, aliphatic polycarbonatepolyol or poly-THF and more than 50 percent by weight of the blocks $X_i$ described above as being according to the invention and have a number average molar mass of greater than 1200 g/mol. Particularly preferred block copolymers consist of less than 50 percent by weight of aliphatic polycarbonatepolyol, poly(ε-caprolactone) or poly-THF and more than 50 percent by weight of the blocks $X_i$ described above as being according to the invention and have a number average molar mass of greater than 1200 g/mol.

Very particularly preferred block copolymers consist of less than 34 percent by weight of aliphatic polycarbonatepolyol, poly(ε-caprolactone) or poly-THF and more than 66 percent by weight of the blocks $X_i$ described above as being according to the invention and have a number average molar mass of greater than 1950 g/mol and less than 9000 g/mol.

The block copolyols described are prepared by alkylene oxide addition processes. Firstly, the base-catalysed addition of reaction of alkylene oxide with starter compounds having Zerewitinoff-active hydrogen atoms $Y(H)_n$ are of industrial importance and secondly the use of double metal cyanide compounds ("DMC catalysts") for carrying out this reaction is becoming increasingly important. Hydrogen bonded to N, O or S is designated as Zerewitinoff-active hydrogen (sometimes also in the "active hydrogen") if it provides methane by reaction with methylmagnesium iodide according to a process discovered by Zerewitinoff. Typical examples of compounds having Zerewitinoff-active hydrogen are compounds which contain carboxyl, hydroxyl, amino, imino or thiol groups as functional groups. Base-catalysed addition reaction of alkylene oxides, such as, for example, ethylene oxide or propylene oxide, with starter compounds having Zerewitinoff-active hydrogen atoms takes place in the presence of alkali metal hydroxides, but alkali metal hydrides, alkali metal carboxylates or alkaline earth metal hydroxides can also be used. After the addition reaction of the alkylene oxides is complete, the polymerization-active centres on the polyether chains must be deactivated, for example by neutralization with dilute mineral acids, such as sulphuric acid or phosphoric acid, and the removal of the resulting salts. In the process according to the invention, DMC catalysts are preferably used. High deactive DMC catalysts which are described, for example, in U.S. Pat. No. 5,470,813, EP-A 700 949, EP-A 743 093, EP-A 761 708, WO 97/40086, WO 98/16310 and WO 00/47649 are particularly preferably used. The highly active DMC catalysts which are described in EP-A 700 949 and, in addition to a double metal cyanide compound (e.g. zinc hexacyanocobaltate(III)) and an organic complex ligand (e.g. tert-butanol), also contain a polyether having a number average molecular weight greater than 500 g/mol are a typical example. Owing to their high activity, these catalysts can be used in such small amounts that further working-up of the polyetherpolyols is not required. The process is described in more detail below. The OH-functional precursor Y present in an amount of less than 50 percent by weight in the block copolymer is used as a "starter polyol", onto which the alkylene oxide is polymerized so that in the end a multiblock copolymer is obtained. Preferably used alkylene oxides are ethylene oxide, propylene oxide, butylene oxide and mixtures thereof. The synthesis of the polyether chains by alkoxylation can be carried out, for example, only with one monomeric epoxide or can also be effected randomly or blockwise with a plurality of different monomeric epoxides.

Preferred combinations of component a) and b) in the preparation of the matrix polymers are:

A) Adducts of butyrolactone, ε-caprolactone and/or methyl-ε-caprolactone with polyetherpolyols having a functionality of 1.8 to 3.1 with number average molar masses of 200 to 4000 g/mol in combination with isocyanurates, uretdiones, iminooxadiazinediones and/or other oligomers based on HDI. Particularly preferably adducts of ε-caprolactone with poly(tetrahydrofurans) having a functionality of 1.9 to 2.2 and number average molar masses of 500 to 2000 g/mol (in particular 600 to 1400 g/mol), the number average total molar mass of which is 800 to 4500 g/mol, in particular 1000 to 3000 g/mol, in combination with oligomers, isocyanurates and/or iminooxadiazinediones based on HDI.

B) Polyesterpolyols based on butane-1,4-diol, hexane-1,6-diol, neopentyl glycol, di-, tri- or polyethylene glycol having a number average molar mass of less than 500 g/mol, tri- and/or tetrapropylene glycol in combination with aliphatic di- or polycarboxylic acids or anhydrides, such as adipic acid and/or succinic acid, or mixtures of abovementioned aliphatic polycarboxylic acids or anhydrides with aromatic polycarboxylic acids or anhydrides, such as terephthalic acid and/or isophthalic acid, the proportion of the aromatic polycarboxylic acids or anhydrides preferably accounting for less than 30 percent by weight, based on the total amount of the polycarboxylic acids or anhydrides used, with number average molar masses between 1000 and 4000 g/mol and functionalities between 1.9 and 3.0, in combination with oligomers, isocyanurates and/or iminooxadiazinediones based on HDI.

C) Polyetherpolyols having number average molar masses of 500 to 8500 g/mol and OH functionalities of 1.8 to 3.2, exclusively based on propylene oxide or random or block copolyols based on propylene oxide and ethylene oxide, the proportion of ethylene oxide not being higher than 60% by weight, in combination with urethanes, allophanates or biurets obtained from aliphatic isocyanate-functional compounds and oligomeric or polymeric isocyanate-reactive compounds having number average molar masses of 200 to 6000 g/mol. Propylene oxide homopolymers having number average molar masses of 1800 to 4500 g/mol and OH functionalities of 1.9 to 2.2 in combination with allophanates obtained from HDI or TMDI and difunctional polyetherpolyols (in particular polypropylene glycols) having number average molar masses of 200 to 2100 g/mol are particularly preferred.

D) Polyether block or multiblock copolymers of the formula II, in which Y is a purely aliphatic polycarbonatepolyol or a polymer of tetrahydrofuran having in each case an OH functionality of 1.8 to 3.1 and number average molar masses of 400 to 2000 g/mol, n is 2, i is 1 or 2 and R is methyl or H, having a total number average molar mass of 1950 to 9000 g/mol, preferably of 1950 to 6000 g/mol, in combination with urethanes, allophanates or biurets obtained from aliphatic isocyanate-functional compounds and oligomeric or polymeric isocyanate-reactive compounds having number average molar masses of 200 to 6000 g/mol or in combination with isocyanurates, uretdiones, iminooxadiazinediones and/or other oligomers based on HDI. Polyether block or multiblock copolymers of the formula II, in which Y is a purely aliphatic polycarbonatepolyol based on 1,4-butanediol and/or 1,6-hexanediol with dimethyl or diethyl carbonate or a polymer of tetrahydrofuran having an OH functionality of 1.8 to 2.2 and number average molar masses of 600 to 1400 g/mol (in particular up to 1000 g/mol), n is 2, i is 1 or 2 and R is methyl or H, the proportion of the ethylene oxide units, based on a total mass of $X_i$, not being higher than 60% by weight, in combination with allophanates obtained from HDI or TMDI and difunctional polyetherpolyols (in particular polypropylene glycols) having number average molar masses of 200 to 2100 g/mol, in combination with biurets having number average molar masses of 200 to 1400 g/mol (in particular as a mixture with other oligomers of difunctional aliphatic isocyanates) based on aliphatic diamines or polyamines and aliphatic diisocyanates, in particular HDI and TMDI, in combination with urethanes obtained from HDI or TMDI, based on adducts of butyrolactone, ε-caprolactone and/or methyl-ε-caprolactone (in particular ε-caprolactone) with aliphatic, araliphatic or cycloaliphatic di-, tri- or polyfunctional alcohols containing 2 to 20 carbon atoms (in particular with difunctional aliphatic alcohols having 3 to 12 carbon atoms) having number average molar masses of 200 to 3000 g/mol, particular preferably of 1000 to 2000 g/mol (in particular as a mixture with other oligomers of difunctional aliphatic isocyanates) or in combination with isocyanurates, iminooxadiazinediones and/or other oligomers based on HDI are particularly preferred.

One or more photoinitiators are used as component e). These are usually initiators which can be activated by actinic radiation and initiate a polymerization of the corresponding polymerizable groups. Photoinitiators are commercially sold compounds known per se, a distinction being made between monomolecular (type I) and bimolecular (type II) initiators. Furthermore, depending on their chemical nature, these initiators are used for free radical, anionic (or) cationic (or mixtures) forms of the abovementioned polymerizations.

(Type I) systems for free radical photopolymerization are, for example, aromatic ketone compounds, e.g. benzophenones, in combination with tertiary amines, alkylbenzophenones, 4,4'-bis(dimethylamino)benzophenone (Michlers ketone), anthrone and halogenated benzophenones or mixtures of said types. (Type II) initiators, such as benzoin and its derivatives, benzyl ketals, acylphosphine oxides, e.g. 2,4,6-trimethylbenzoyldiphenylphosphine oxide, bisacylphosphine oxides, phenylglyoxilic acid esters, camphorquinone, alpha-aminoalkylphenones, alpha-,alpha-dialkoxyacetophenones, 1-[4-(phenylthio)phenyl]octane-1,2-dione 2-(O-benzoyl-oxime), differently substituted hexarylbisimidazoles (HABI), with suitable coinitiators, such as, for example, mercaptobenzoxazole and alpha-hydroxyalkylphenones, are furthermore suitable. The photoinitiator systems described in EP-A 0223587 and consisting of a mixture of an ammonium arylborate and one or more dyes can also be used as a photoinitiator. For example, tetrabutylammonium triphenylhexylborate, tetrabutylammonium triphenylbutylborate, tetrabutylammonium trinapthylbutylborate, tetramethylammonium triphenylbenzylborate, tetra(n-hexyl)ammonium (sec-butyl) triphenylborate, 1-methyl-3-octylimidazolium dipentyldiphenylborate, tetrabutylammonium tris(4-tert-butyl)phenylbutylborate, tetrabutylammonium tris(3-fluorophenyl) hexylborate and tetrabutylammonium tris(3-chloro-4-methylphenyl)hexylborate are suitable as the ammonium arylborate. Suitable dyes are, for example, new methylene blue, thionine, basic yellow, pinacynol chloride, rhodamine 6G, gallocyanine, ethyl violet, Victoria blue R, Celestine blue, quinaldine red, crystal violet, brilliant green, astrazone orange G, Darrow red, pyronine Y, Basic Red 29, pyrillium I, safranine O, cyanine and methylene blue, azure A (Cunningham et al., RadTech'98 North America UV/EB Conference Proceedings, Chicago, Apr. 19-22, 1998).

The photoinitiators used for the anionic polymerization are as a rule (type I) systems and are derived from transition metal complexes of the first series. Chromium salts, such as, for example, trans-$Cr(NH_3)_2(NCS)_4$— (Kutal et al, Macromolecules 1991, 24, 6872) or ferrocenyl compounds (Yamaguchi et al. Macromolecules 2000, 33, 1152) are suitable here. A further possibility of anionic polymerization consists in the use of dyes such as crystal violet leuconitrile or malachite green leuconitrile, which can polymerize cyanoacrylates by photolytic decomposition (Neckers et al. Macromolecules 2000, 33, 7761). However, the chromophore is incorporated into the polymer thereby so that the resulting polymers are coloured throughout.

The photoinitiators used for the cationic polymerization substantially comprise three classes: aryldiazonium salts, onium salts (here specifically: iodonium, sulphonium and selenonium salts) and organometallic compounds. On irradiation both in the presence and in the absence of a hydrogen donor, phenyldiazonium salts can produce a cation which initiates the polymerization. The efficiency of the overall system is determined by the nature of the counterion used for the diazonium compound. The not very reactive but very expensive $SbF_6^-$, $AsF_6^-$ or $PF_6^-$ are suitable here. These compounds are as a rule not very suitable for use in coating thin films since the surface quality is reduced (pinholes) by the nitrogen liberated after the exposure (Li et al., Polymeric Materials Science and Engineering, 2001, 84, 139). Onium salts, especially sulphonium and iodonium salts, are very widely used and also commercially available in many forms. The photochemistry of these compounds has been investigated over a long time. After excitation, the iodonium salts initially decompose homolytically and thus produce a free radical and a radical anion, which is stabilized by H abstraction and releases a proton and then initiates the cationic polymerization (Dektar et al. J. Org. Chem. 1990, 55, 639; J. Org. Chem., 1991, 56, 1838). This mechanism permits the use of iodonium salts also for free radical photopolymerization. The choice of the counterion is once again very important here, and $SbF_6^-$, $AsF_6^-$ or $PF_6^-$ is likewise preferred. In this structure class, the choice of the substitution of the aromatics is otherwise very free and is determined substantially by the availability of suitable starting building blocks for the synthesis. The sulphonium salts are compounds which decompose according to Norrish(II) (Crivello et al., Macromolecules, 2000, 33, 825). In the case of the sulphonium salts, too, the choice of the counterion is of critical importance, which manifests itself substantially in the curing rate of the polymers. The best results are as a rule obtained with $SbF_6^-$ salts. Since the self-absorption of iodonium and sulphonium salts is at <300 nm, these compounds must be appropriately sensitized for the photopolymerization with near UV or shortwave with visible light. This is effected by the use of more highly absorbing aromatics, such as, for example, anthracene and derivatives (Gu et al., Am. Chem. Soc. Polymer Preprints, 2000, 41 (2), 1266) or phenothiazine or derivatives thereof (Hua et al, Macromolecules 2001, 34, 2488-2494).

It may also be advantageous to use mixtures of these compounds. Depending on the radiation source used for the curing, type and concentration must be adapted to the photoinitiator in a manner known to the person skilled in the art. More details are described, for example, in P. K. T. Oldring (Ed.), Chemistry & Technology of UV & EB Formulations For Coatings, Inks & Paints, Vol. 3, 1991, SITA Technology, London, pages 61-328.

Preferred photoinitiators e) are mixtures of tetrabutylammonium triphenylhexylborate, tetrabutylammonium triphenylbutylborate, tetrabutylammonium trinapthylbutylborate, tetrabutylammonium tris(4-tert-butyl)phenylbutylborate, tetrabutylammonium tris(3-fluoro-phenyl)hexylborate and tetrabutylammonium tris(3-chloro-4-methylphenyl)hexylborate with dyes, such as, for example, astrazone orange G, methylene blue, new methylene blue, azure A, pyrillium I, safranine O, cyanine, gallocyanine, brilliant green, crystal violet, ethyl violet and thionine.

The photoinitiator system used may preferably comprise an anionic, cationic or neutral dye and a coinitiator.

Further constituents of the photopolymer formulation may be: d) free radical stabilizers, f) optionally catalysts or g) other auxiliaries and additives.

Inhibitors and antioxidants, as described, for example in "Methoden der organic Chemie [Methods of Organic Chemistry]" (Houben-Weyl), 4th edition, volume XIV/1, page 433 et seq., Georg Thieme Verlag, Stuttgart 1961, are suitable as examples of free radical stabilizers. Suitable classes of substances are, for example, phenols, such as, for example, 2,6-di-tert-butyl-4-methylphenol, cresols, hydroquinones, benzyl alcohols, such as, for example, benzhydrol, optionally also quinones, for example, 2,5-di-tert-butylquinone, optionally also aromatic amines, such as diisopropylamine or phenothiazine.

2,6-Di-tert-butyl-4-methylphenol, phenothiazine, p-methoxyphenol, 2-methoxy-p-hydroquinone and benzhydrol are preferred.

One or more catalysts may optionally be used. These are catalysts for accelerating the urethane formation. Known catalysts for this purpose are, for example, tin octoate, zinc octoate, dibutyltin dilaurate, dimethylbis[(1-oxoneodecyl)oxy]stannane, dimethyltin dicarboxylate, zirconium bis(ethylhexanoate), zirconium acteylacetonate or tertiary amines, such as, for example, 1,4-diazabicyclo[2.2.2]octane, diazabicyclononane, diazabicycloundecane, 1,1,3,3-tetramethylguanidine, 1,3,4,6,7,8-hexahydro-1-methyl-2H-pyrimido(1,2-a)pyrimidine.

Dibutyltin dilaurate, dimethylbis[(1-oxoneodecyl)oxy]stannane, dimethyltin dicarboxylate, 1,4-diazabicyclo[2.2.2]octane, diazabicyclononane, diazabicycloundecane, 1,1,3,3-tetramethyl-guanidine, 1,3,4,6,7,8-hexahydro-1-methyl-2H-pyrimido(1,2-a)pyrimidine are preferred.

Of course, further auxiliaries or additives may optionally be used. These may be, for example, additives customary in the area of coating technology, such as solvents, plasticizers, levelling agents or adhesion promoters. It may also be advantageous simultaneously to use a plurality of additives of one type. Of course, it may also be advantageous to use a plurality of additives of a plurality of types.

The photopolymer formulation may additionally contain urethanes as plasticizers, where the urethanes may preferably be substituted by at least one fluorine atom.

The urethanes are preferably compounds which have a structural element of the general formula III.

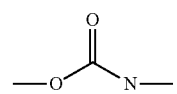

formula III

They can be obtained from monofunctional alcohols and monofunctional isocyanates as described above. They are preferably substituted by at least one fluorine atom.

It is more preferred if the fluorourethanes have the general formula IV

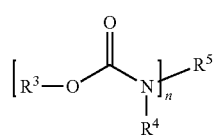

formula IV in which n is ≥1 and n is ≤8, and $R^3$, $R^4$, $R^5$ are hydrogen and/or, independently of one another, linear, branched, cyclic or heterocyclic organic radicals which are unsubstituted or optionally also substituted by heteroatoms, at least one of the radicals $R^3$, $R^4$, $R^5$ being substituted by at least one fluorine atom. Here, $R^3$ is particularly preferably an organic radical having at least one fluorine atom.

According to a further embodiment, $R^3$ may comprise 1-20 $CF_2$ groups and/or one or more $CF_3$ groups, particularly preferably 1-15 $CF_2$ groups and/or one or more $CF_3$ groups, particularly preferably 1-10 $CF_2$ groups and/or one or more $CF_3$ groups, very particularly preferably 1-8 $CF_2$ groups and/or one or more $CF_3$ groups, $R^4$ may comprise a C1-C20 alkyl radical, preferably a C1-C15 alkyl radical, particularly preferably a C1-C10 alkyl radical or hydrogen, and/or $R^5$ may comprise a C1-C20 alkyl radical, preferably a C1-C15 alkyl radical, particularly preferably a C1-C10 alkyl radical, or hydrogen.

The fluorourethanes may have a fluorine content of 10-80% by weight of fluorine, preferably of 13-70% by weight of fluorine and particularly preferably 17.5-65% by weight of fluorine.

According to a further preferred embodiment of the invention, it is intended for the photopolymer formulation to contain 10 to 89.999% by weight, preferably 25 to 70% by weight, of matrix polymers, 10 to 60% by weight, preferably 25 to 50% by weight, of writing monomers, 0.001 to 5% by weight of photoinitiators and optionally 0 to 4% by weight, preferably 0 to 2% by weight, of catalysts, 0 to 5% by weight, preferably 0.001 to 1% by weight, of free radical stabilizers, 0 to 30% by weight, preferably 0 to 25% by weight, of plasticizers and 0 to 5% by weight, preferably 0.1 to 5% by weight, of further additives, the sum of all constituents making 100% by weight.

Photopolymer formulations comprising 25 to 70% by weight of matrix polymers consisting of compounds of component a) and of component b), 25 to 50% by weight of writing monomers, 0.001 to 5% by weight of photoinitiators, 0 to 2% by weight of catalysts, 0.001 to 1% by weight of radical stabilizers, optionally 0 to 25% by weight of the urethanes described above and optionally 0.1 to 5% by weight of further additives are particularly preferably used.

A second aspect of the invention relates to the use of a photopolymer formulation according to the invention for the production of optical elements, in particular for the production of holographic elements and images. The holographic elements may have, for example, the function of an optical lens, of a mirror, of a deflection mirror, of a filter, of a diffuser screen, of a diffraction element, of a light conductor, of a waveguide, of a projection screen and/or of a mask. In addition, it is also possible to produce holographic images or representations, for example for personal portraits, biometric representations in security documents, or generally of images or image structures for advertising, security labels, trade mark protection, trade mark branding, labels, design elements, decorations, illustrations, multi journey cards, images and the like, and images which can represent digital data, inter alia also in combination with the products described above. A sheet, a film, a layer, a layer structure or a moulding can also be produced from the photopolymer formulation according to the invention.

A third aspect of the invention is a process for the preparation of a photopolymer formulation according to the invention, in which matrix polymers, writing monomers, photoinitiators, optionally plasticizers and optionally further additives are mixed to give the photopolymer formulation.

The present invention therefore furthermore relates to a process for the production of media for recording visual holograms, in which such photopolymer formulations are applied to a substrate in a mould and are cured. The invention also relates to the media thus obtainable.

The process according to the invention is preferably carried out in such a way that the components of polyurethane compositions according to the invention, with the exception of the component a), are homogeneously mixed with one another, and component a) is admixed only immediately before application to the substrate or in the mould.

For mixing, all processes and apparatuses known per se to the person skilled in the art from mixing technology, such as, for example, stirred vessels or both dynamic and static mixers, can be used. However, apparatuses without dead spaces or with only few dead spaces are preferred. Furthermore, processes in which the mixing is effected within a very short time and with very thorough mixing of the two components to be mixed are preferred. In particular, dynamic mixers, especially those in which the components come into contact with one another only in the mixer, are suitable for this purpose.

The temperatures during the procedure are 0 to 100° C., preferably 10 to 80° C., particularly preferably 20 to 60° C.

If necessary, degassing of the individual components or of the total mixture under a reduced pressure of, for example, 1 mbar can also be carried out. Degassing, in particular after addition of the component a), is preferred in order to prevent bubble formation by residual gases in the media obtainable.

Prior to admixing of the component a), the mixtures can be stored as a storage-stable intermediate, optionally over several months.

After the admixing of the component a) of the polyurethane compositions according to the invention, a liquid formulation is obtained which, depending on the composition, cures at room temperature within a few seconds to a few hours.

The ratio as well as the type and reactivity of the components of the polyurethane compositions are preferably adjusted so that the curing after admixing the component a) at room temperature occurs within minutes to 16 hours.

The abovementioned adjustment with regard to the curing behaviour is easily possible for the person skilled in the art in the form of routine experiments within the abovementioned quantity range of the components and the components available in each case, in particular the preferred components.

Immediately after complete mixing of all components, the polyurethane compositions according to the invention have viscosities at 25° C. of typically 10 to 100 000 mPa·s, preferably 100 to 20 000 mPa·s, particularly preferably 200 to 10 000 mPa·s, especially preferably 500 to 5000 mPa·s, so that they have very good processing properties even in solvent-free form. In solution with suitable solvents, viscosities at 25° C. below 10 000 mPa·s, preferably below 2000 mPa·s, particularly preferably below 500 mPa·s, can be established.

Polyurethane compositions of the abovementioned type which, in an amount of 15 g and with a catalyst content between 0.005% by weight and 0.1% by weight, cure at 25° C. in less than 4 hours have proved to be advantageous.

For application to a substrate or in a mould, all respective customary methods known to a person skilled in the art, such as, in particular, knifecoating, pouring, printing, screen printing, spraying or inkjet printing, are suitable.

A fourth aspect of the invention is a process for exposing holographic media comprising a photopolymer formulation according to the invention, in which the writing monomers are selectively polymerized by electromagnetic radiation.

EXAMPLES

The following examples serve for illustrating the invention. Unless noted otherwise, all stated percentages are based on percent by weight.

Starting Materials:

Isocyanate component 1 is an experimental product of Bayer MaterialScience AG, Leverkusen, Germany, hexane diisocyanate-based polyisocyanate, proportion of iminooxadiazinedione at least 30%, NCO content: 23.5%.

Isocyanate component 2 is an experimental product of Bayer MaterialScience AG, Leverkusen, Germany, full allophanate of hexane diisocyanate on polypropylene glycol having a number average molar mass of 4000 g/mol, NCO content: 5.6-6.4%.

Isocyanate component 3 is an experimental product of Bayer MaterialScience AG, Leverkusen, Germany, aliphatic polyisocyanate based on hexane diisocyanate, NCO content about 20%.

Isocyanate component 4 is an experimental product of Bayer MaterialScience AG, Leverkusen, Germany, full allophanate of hexane diisocyanate on polypropylene glycol having a number average molar mass of about 280 g/mol, NCO content: 16.5-17.3%.

Isocyanate component 5 is a commercial product of Bayer MaterialScience AG, Leverkusen, Germany, mixture of 29.4 mol % of isocyanurate based on HDI with 70.6 mol % of the urethane of poly(ε-caprolactone) having a number average molar mass of 650 g/mol with HDI, NCO content 10.5-11.5%.

Isocyanate component 6 is a commercial product of Bayer MaterialScience AG, Leverkusen, Germany, aliphatic biuret type based on hexamethylene diisocyanate, NCO content: 22.5-23.5%.

Polyol 1 is an experimental product of Bayer MaterialScience AG, Leverkusen, Germany, the preparation is described below.

Polyol 2 is a commercial product of Bayer MaterialScience AG, Leverkusen, Germany, polypropylene oxide having an average molar mass of 4000 g/mol.

Polyol 3 is an experimental product of Bayer MaterialScience AG, Leverkusen, Germany, the preparation is described below.

Polyol 4 is an experimental product of Bayer MaterialScience AG, Leverkusen, Germany, the preparation is described below.

Polyol 5 is an experimental product of Bayer MaterialScience AG, Leverkusen, Germany, the preparation is described below.

Polyol 6 is an experimental product of Bayer MaterialScience AG, Leverkusen, Germany, the preparation is described below.

Polyol 7 is an experimental product of Bayer MaterialScience AG, Leverkusen, Germany, the preparation is described below.

Polyol 8 is an experimental product of Bayer MaterialScience AG, Leverkusen, Germany, the preparation is described below.

Polyol 9 is an experimental product of Bayer MaterialScience AG, Leverkusen, Germany, the preparation is described below.

Polyol 10 is a commercial product of Bayer MaterialScience AG, Leverkusen, Germany, polyester based on adipic acid, hexanediol, neopentyl glycol having a number average molar mass of 2000 g/mol.

DMC catalyst: double metal cyanide catalyst based on zinc hexacyanocobaltate(III), obtainable by the process described in EP-A 700 949.

Irganox 1076 is octadecyl 3,5-di-(Cert)-butyl-4-hydroxyhydrocinnamate (CAS 2082-79-3).

Acrylate 1 is bisphenol A ethoxylate (1.5 EO/phenol)-diacrylate and was obtained from SIGMA-ALDRICH CHEMIE GmbH, Steinheim, Germany. $n_D^{20}$: 1.570.

Acrylate 2 is phenylthioethyl acrylate and was obtained from Bimax, Cockeysville, Md., USA. $n_D^{20}$:1.603.

Acrylate 3 is an experimental product of Bayer MaterialScience AG, Leverkusen, Germany, the preparation is described below.

Acrylate 4 is an experimental product of Bayer MaterialScience AG, Leverkusen, Germany, the preparation is described below.

Acrylate 5 is an experimental product of Bayer MaterialScience AG, Leverkusen, Germany, the preparation is described below.

Acrylate 6 is an experimental product of Bayer MaterialScience AG, Leverkusen, Germany, the preparation is described below.

Acrylate 7 is an experimental product of Bayer MaterialScience AG, Leverkusen, Germany, the preparation is described below.

Catalyst 1: urethanization catalyst, dimethylbis[(1-oxoneodecyl)oxy]stannane, commercial product of Momentive Performance Chemicals, Wilton, Conn., USA (used as a 10% strength solution in N-ethylpyrrolidone).

Coinitiator 1: tetrabutylammonium tris(3-chloro-4-methylphenyl)(hexyl)borate, [1147315-11-4]) is an experimental product produced by Ciba Inc., Basel, Switzerland.

Coinitiator 2 consists of 66.7% by weight of tetrabutylammonium triphenylbutylborate [12307-06-4] (obtained from Showa-Denko, Fine Chemicals Group, Specialty Chemicals Department, Chemicals Division, SHOWA DENKO K.K., Japan) and 33.3% by weight of 2-mercaptobenzimidazole (CAS No. 583-39-1, obtained from ABCR GmbH, Karlsruhe, Germany).

Dye 1 is new methylene blue (CAS 1934-16-3) and was obtained from SIGMA-ALDRICH CHEMIE GmbH, Steinheim, Germany.

Dye 2 is safranine 0 (CAS 477-73-6) and was obtained from SIGMA-ALDRICH CHEMIE GmbH, Steinheim, Germany.

Dye 3 is ethyl violet (CAS 2390-59-2) and was obtained in 80% purity from SIGMA-ALDRICH CHEMIE GmbH, Steinheim, Germany, and used in this form.

The additives 1 to 37 are experimental products of Bayer MaterialScience AG, Leverkusen, Germany, the preparation of which is described below.

Methods of Measurement:

The stated OH numbers were determined according to DIN 53240-2.

The stated NCO values (isocyanate contents) were determined according to DIN EN ISO 11909.

The stated viscosities were determined in the following manner:

For the determination of the viscosity, the component or mixture to be investigated was applied at 20° C. in a cone-and-plate measuring system of a rheometer (from Anton Paar Physica, model MCR 51). The measurement is carried out under the following conditions:

Measuring body: cone CP 25, d=25 mm, angle=1°
Measuring gap and spacing between cone and plate: 0.047 mm
Duration of measurement: 10 sec
Determination of viscosity at a shear rate of 250 l/sec.

Measurement of the refractive indices with the photopolymerizable writing monomers c)

The refractive index n as a function of the wavelength of the samples was obtained from the transmission and reflection spectra. For this purpose, about 100-300 nm thick films of the samples were applied by spin coating to quartz glass substrates from dilute solution in butyl acetate. The transmission and reflection spectrum of this layer packet was measured using a spectrometer from STEAG ETA-Optik, CD-Measurement System ETA-RT, and the layer thickness and the spectral curve of n were then fitted to the measured transmission and reflection spectra in the range of 380-850 nm. This is effected using the internal software of the spectrometer and additionally requires the refractive index data of the quartz glass substrate, which were determined beforehand in a blank measurement. The refractive indices for the photopolymerizable monomers c) are based on the wavelength of 405 nm and therefore correspond to $n_D^{20}$.

Measurement of the holographic properties DE and Δn of the holographic media by means of two-beam interference in reflection arrangement.

The holographic media produced as described below were then tested by means of a measuring arrangement according to FIG. 1 as follows with regard to the holographic properties:

The beam of an He—Ne laser (emission wavelength 633 nm) was converted with the aid of the spatial filter (SF) and together with the collimation lens (CL) into a parallel homogeneous beam. The final cross sections of the signal and reference beam are established by the iris diaphragms (I). The diameter of the iris diaphragm opening is 0.4 cm. The polarization-dependent beam splitters (PBS) split the laser beam into two coherent identically polarized beams. Via the λ/2 plates, the power of the reference beam was adjusted to 0.5 mW and the power of the signal beam to 0.65 mW. The powers were determined using the semiconductor detectors (D) with sample removed. The angle of incidence ($\alpha_0$) of the reference beam is −21.8° and the angle of incidence ($\beta_0$) of the signal beam is 41.8°. The angles are measured starting from the sample normal to the beam direction. According to FIG. 1, $\alpha_0$ therefore has a negative sign and $\beta_0$ a positive sign. At the location of the sample (medium), the interference field of the two overlapping beams produced a grating of light and dark strips which are perpendicular to the angle bisectors of the two beams incident in the sample (reflection hologram). The strip spacing Λ, also referred to as grating period, in the medium is ~225 nm (the refractive index of the medium would seem to be ~1.504).

FIG. 1 shows the geometry of a Holographic Media Tester (HMT) at λ=633 nm (He—Ne Laser): M=mirror, S=shutter, SF=spatial filter, CL=collimator lens, λ/2=λ/2 plate, PBS=polarization-sensitive beam splitter, D=detector, I=iris diaphragm, $\alpha_0$=−21.8°, β=41.8° are the angles of incidence of the coherent beams, measured outside the sample (outside the medium). RD=reference direction of the turntable.

Holograms were recorded in the medium in the following manner:

Bolt shutters (S) are opened for the exposure time t.
Thereafter, with the closed shutters (S), the medium was allowed to time for 5 minutes with the diffusion of the still unpolymerized writing monomers.

The recorded holograms were read in the following manner. The shutter of the signal beam remained closed. The shutter of the reference beam was opened. The iris diaphragm of the reference beam was closed to a diameter of <1 mm. This ensured that the beam was always completely in the previously recorded hologram for all angles (Ω) of rotation of the medium. The turntable, under computer control, covered the angle range from $\Omega_{min}$ to $\Omega_{max}$ with an angle step width of 0.05°. Ω is measured from the sample normal to the reference direction of the turntable. The reference direction of the turntable occurs when, during recording of the hologram, the angle of incidence of the reference beam and of the signal beam are of equal magnitude, i.e. $\alpha_0$=−31.8° and $\beta_0$=31.8°. $\Omega_{recording}$ is then 0°. For $\alpha_0$=−21.8° and $\beta_0$=41.8°, $\Omega_{recording}$ is therefore 10°. The following is generally true for the interference field during recording of the hologram:

$$\alpha_0 = \theta_0 + \Omega_{recording}.$$

$\theta_0$ is the semiangle in the laboratory system outside the medium and the following is true during recording of the hologram:

$$\theta_0 = \frac{\alpha_0 - \beta_0}{2}.$$

In this case, $\theta_0$ is therefore −31.8°. At each angle Ω of rotation approached, the powers of the beam transmitted in the zeroth order were measured by means of the corresponding detector D and the powers of beam transmitted in the first order were measured by means of the detector D. At each angle Ω approach, the diffraction efficiency was obtained as the quotient of:

$$\eta = \frac{P_D}{P_D + P_T}$$

$P_D$ is the power in the detector of the diffracted beam and $P_T$ is the power in the detector of the transmitted beam.

By means of the method described above, the Bragg curve (described as the diffraction efficiency η as a function of the angle Ω of rotation of the recorded hologram) was measured and was stored in a computer. In addition, the intensely transmitted in the zero order was also plotted against the angle Ω of rotation and was stored in a computer.

The maximum diffraction efficiency (DE=$\eta_{max}$) of the hologram, i.e. speak value, was determined at $\Omega_{reconstruction}$. For this purpose, the position of the detector of the refracted beam had to be changed, if necessary, in order to determine this maximum value.

The refractive index contrast Δn and the thickness d of the photopolymer layer were now determined by means of the Coupled Wave Theory (cf. H. Kogelnik, The Bell System Technical Journal, Volume 48, November 1969, Number 9, page 2909-page 2947) from the measured Bragg curve and the angle variation of the transmitted intensity. It should be noted that, owing to the thickness shrinkage occurring as a result of the photopolymerization, the strip spacing Λ' of the hologram and the orientation of the strips (slant) may deviate from the strip spacing Λ of the interference pattern and the orientation thereof. Accordingly, the $\alpha_0$' or the corresponding angle of the turntable $\Omega_{reconstruction}$ at which maximum diffraction efficiency is achieved will also deviate from $\alpha_0$ or from the corresponding $\Omega_{recording}$, respectively. As a result, the Bragg condition changes. This change is taken in to account in the evaluation method. The evaluation method is described below:

all geometrical quantities which relate to the recorded hologram and not to the interference pattern are represented as quantities shown by dashed lines.

According to Kogelnik, the following is true for the Bragg curve η(Ω) of a reflection hologram:

$$\eta = \begin{cases} \cfrac{1}{1 - \cfrac{1-(\xi/\nu)^2}{\sin^2\left(\sqrt{\xi^2 - \nu^2}\right)}}, & \text{for } \nu^2 - \xi^2 < 0 \\ \cfrac{1}{1 + \cfrac{1-(\xi/\nu)^2}{\sinh^2\left(\sqrt{\nu^2 - \xi^2}\right)}}, & \text{for } \nu^2 - \xi^2 \geq 0 \end{cases}$$

with:

$$\nu = \frac{\pi \cdot \Delta n \cdot d'}{\lambda \cdot \sqrt{|c_s \cdot c_r|}}$$

$$\xi = -\frac{d'}{2 \cdot c_s} \cdot DP$$

$$c_s = \cos(\vartheta') - \cos(\psi') \cdot \frac{\lambda}{n \cdot \Lambda'}$$

$$c_r = \cos(\vartheta')$$

$$DP = \frac{\pi}{\Lambda'} \cdot \left(2 \cdot \cos(\psi' - \vartheta') - \frac{\lambda}{n \cdot \Lambda'}\right)$$

$$\psi' = \frac{\beta' + \alpha'}{2}$$

$$\Lambda' = \frac{\lambda}{2 \cdot n \cdot \cos(\psi' - \alpha')}$$

When reading the hologram ("reconstruction"), the situation is analogous to that described above:

$$\vartheta'_0 = \theta_0 + \Omega$$

$$\sin(\vartheta'_0) = n \cdot \sin(\theta')$$

Under the Bragg condition, the "Dephasing" DP is 0. Accordingly, the following is true:

$$\alpha'_0 = \theta_0 + \Omega_{reconstruction}$$

$$\sin(\alpha'_0) = n \cdot \sin(\alpha')$$

The still unknown angle β' can be determined from the comparison of the Bragg condition of the interference field during recording of the hologram and the Bragg condition during reading of the hologram, assuming that only thickness shrinkage takes place. The following is then true:

$$\sin(\beta') = \frac{1}{n} \cdot [\sin(\alpha_0) + \sin(\beta_0) - \sin(\theta_0 + \Omega_{reconstruction})]$$

ν is the grating thickness, ξ is the detuning parameter and Ψ is the orientation (slant) of the refractive index grating which was recorded. α' and β' correspond to the angles $\alpha_0$ and $\beta_0$ of the interference field during recording of the hologram, but measured in the medium and applicable to the grating of the hologram (after thickness shrinkage). n is the mean refractive index of the photopolymer and was set at 1.504. λ is the wavelength of the laser light in vacuo.

The maximum diffraction efficiency (DE=$\eta_{max}$) for ξ=0 is then:

$$DE = \tanh^2(\nu) = \tanh^2\left(\frac{\pi \cdot \Delta n \cdot d'}{\lambda \cdot \sqrt{\cos(\alpha') \cdot \cos(\alpha' - 2\psi)}}\right)$$

Figure 2:
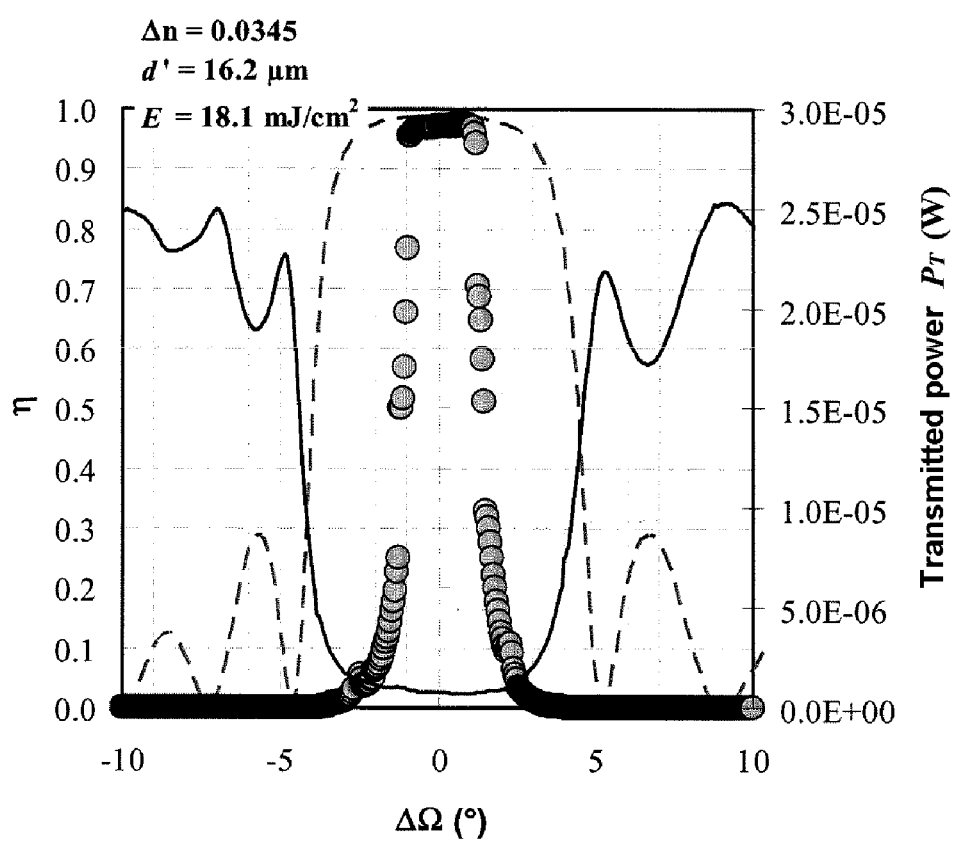
FIG. 2 illustrates the measured data of the diffraction efficiency, the theoretical Bragg curve and the transmitted intensity, plotted against the angle detuning.

The measured data of the diffraction efficiency, the theoretical Bragg curve and the transmitted intensity are plotted against the centred angle of rotation $\Delta\Omega = \Omega_{reconstruction} - \Omega = \alpha'_0 - \vartheta'_0$, also referred to as angle detuning, and shown in FIG. 2.

Since DE is known, the shape of the theoretical Bragg curve according to Kogelnik is determined only by the thickness d' of the photopolymer layer. Δn is corrected via DE for a given thickness d' so that measurement and theory of DE always agree. d' is now adjusted until the angular positions of the first secondary minima of the theoretical Bragg curve correspond to the angular positions of the first secondary maxima of the transmitted intensity and in addition a full width at half maximum (FWHM) for the theoretical Bragg curve and for the transmitted intensity correspond.

Since the direction in which a reflection hologram rotates on reconstruction by means of an Ω scan, but the detector for diffracted light can detect only at finite angular range, the Bragg curve of broad holograms (small d') is not completely registered with an Ω scan, but only the central region, with suitable detector positioning. The shape of the transmitted intensity which is complementary to the Bragg curve is therefore additionally used for adjusting the layer thickness d'.

FIG. 2 shows the measured transmitted power $P_T$ (right y axis) as a solid line plotted against the angle of detuning $\Delta\Omega$, the measured diffraction efficiency η (left y axis) as solid circles plotted against the angle detuning $\Delta\Omega$ (if permitted by the finite size of the detector) and the adaptation of the Kogelnik theory as a dashed line (lefty axis).

For one formulation, this procedure was possibly repeated several times for different exposure times t on different media in order to determine at which mean energy dose of the incident laser beam during recording of the hologram DE reaches the saturation value. The mean energy dose E is obtained as follows from the powers of the two partial beams coordinated with the angles $\alpha_0$ and $\beta_0$ (reference beam with $P_r$=0.50 mW and signal beam with $P_s$=0.63 mW), the exposure time t and the diameter of the iris diaphragm (0.4 cm):

$$E(mJ/cm^2) = \frac{2 \cdot [P_r + P_s] \cdot t(s)}{\pi \cdot 0.4^2 \text{ cm}^2}$$

The powers of the partial beams were adjusted so that, at the angles $\alpha_0$ and $\beta_0$ used, the same power density is reached in the medium.

As an alternative I, the test equivalent to the setup shown in FIG. 1 was also carried out using a green laser having the emission wavelength 2 of 532 nm. Here, $\alpha_0$=−11.5° and $\beta_0$=33.5° and $P_r$=1.84 mW and $P_s$=2.16 mW.

In examples, in each case the maximum value in Δn is reported, and the doses used are between 4 and 64 mJ/cm² per arm.

Preparation of Polyol 1:

In a 1 l flask, 0.18 g of tin octoate, 374.8 g of ε-caprolactone and 374.8 g of a difunctional polytetrahydrofuranpolyetherpolyol (equivalent weight 500 g/mol OH) were initially introduced and heated to 120° C. and kept at this temperature until the solids content (proportion of non-volatile constituents) was 99.5% by weight or above. Thereafter, cooling was effected and the product was obtained as a wax solid.

Preparation of Polyol 3:

2465 g of a difunctional polytetrahydrofuranpolyetherpolyol (equivalent weight 325 g/mol OH) were weighed into a 20 l reaction vessel equipped with a stirrer and 450.5 mg of DMC catalyst were added. Heating to 105° C. was then effected with stirring at about 70 rpm. Air was exchanged for nitrogen by applying the vacuum and eliminating the vacuum with nitrogen three times. After increasing the stirrer speed to 300 rpm, nitrogen was passed through the mixture from below for 72 minutes with a vacuum pump running and at a pressure of about 0.1 bar. Thereafter, a pressure of 0.3 bar was established by means of nitrogen and 242 g of propylene oxide (PO) were passed in to start the polymerization. The pressure increased to 2.03 bar thereby. After 8 minutes, the pressure had fallen again to 0.5 bar, and a further 12.538 kg of PO were metered in at 2.34 bar over a period of 2 h 11 min. 17 minutes after the end of the PO metering, a vacuum was applied at residual pressure of 1.29 bar and complete degassing was effected. The product was stabilized by addition of 7.5 g of Irganox 1076 and obtained as a colourless, viscous liquid (OH number: 27.8 mg KOH/g, viscosity at 25° C.: 1165 mPa·s).

Preparation of Polyol 4:

2475 g of a difunctional polytetrahydrofuranpolyetherpolyol (equivalent weight 325 g/mol OH) were weighed into a 20 l reaction vessel equipped with a stirrer and 452.6 mg of DMC catalyst were added. Heating to 105° C. was then effected with stirring at about 70 rpm. Air was exchanged for nitrogen by applying the vacuum and eliminating the vacuum with nitrogen three times. After increasing the stirrer speed to 300 rpm, nitrogen was passed through the mixture from below for 57 minutes with a vacuum pump running and at a pressure of about 0.1 bar. Thereafter, a pressure of 0.5 bar was established by means of nitrogen and 100 g of ethylene oxide (EO) and 150 g of PO were passed in simultaneously to start the polymerization. The pressure increased to 2.07 bar thereby. After 10 minutes, the pressure had fallen again to 0.68 bar, and a further 5.116 kg of E0 and 7.558 kg of PO as a mixture were metered in at 2.34 bar over a period of 1 h 53 min. 31 minutes after the end of the epoxide metering, a vacuum was applied at residual pressure of 2.16 bar and complete degassing was effected. The product was stabilized by addition of 7.5 g of Irganox 1076 and obtained as a slightly cloudy, viscous liquid (OH number: 27.1 mg KOH/g, viscosity at 25° C.: 1636 mPa·s).

Preparation of Polyol 5:

1707 g of a polycarbonatediol having a number average molar mass of 650 g/mol, prepared by polycondensation of (3-methyl)-1,5-pentanediol and diphenyl carbonate, were weighed into a 20 l reaction vessel and 527 mg of DMC catalyst were added. Heating to 130° C. was then effected with stirring at about 70 rpm. Air was exchanged for nitrogen by applying a vacuum and eliminating the vacuum with nitrogen three times. After increasing the stirrer speed to 300 rpm, nitrogen was passed through the mixture from below for 85 minutes with the vacuum pump running and at a pressure of about 0.1 bar. Thereafter, a pressure of 0.2 bar was established by means of nitrogen and 174 g of PO were passed in to start the polymerization. The pressure increased to 2.26 bar thereby. After 6 minutes, pressure had fallen again to 0.55 bar and a further 8.826 kg of PO were passed in at 1.36 bar over a period of 1 h 32 min. 22 minutes after the end of the PO metering, the vacuum was applied at a residual pressure of 0.674 bar and complete degassing was effected. The product was stabilized by adding 5.27 g of Irganox 1076 and obtained as a colourless, viscous liquid (OH number 24.8 mg KOH/g, viscosity at 25° C.: 1659 mPa·s).

Preparation of Polyol 6:

3.621 kg of a difunctional polytetrahydrofuranpolyetherpolyol (equivalent weight 500 g/mol OH) were weighed into a 20 l reaction vessel equipped with a stirrer and 525 mg of DMC catalyst were added. Heating to 105° C. was then effected with stirring at about 70 rpm. Air was exchanged for nitrogen by applying the vacuum and eliminating the vacuum with nitrogen three times. After increasing the stirrer speed to 300 rpm, nitrogen was passed through the mixture from below for 54 minutes with a vacuum pump running and at a pressure of about 0.1 bar. Thereafter, a pressure of 0.2 bar was established by means of nitrogen and 363 g of propylene oxide (PO) were passed in to start the polymerization. The pressure increased to 2.42 bar thereby. After 7 minutes, the pressure had fallen again to 0.34 bar, and a further 11.379 kg of PO were metered in at 2.9 bar over a period of 2 h 29 min. 47 minutes after the end of the PO metering, a vacuum was applied at residual pressure of 1.9 bar and complete degassing was effected. The product was stabilized by addition of 7.5 g of Irganox 1076 and obtained as a colourless, viscous liquid (OH number: 27.6 mg KOH/g, viscosity at 25° C.: 1498 mPa·s).

Preparation of Polyol 7:

250 g of a difunctional polytetrahydrofuranpolyetherpolyol (equivalent weight 325 g/mol OH) were weighed into a 1 l stainless steel reactor and 22.1 mg of DMC catalyst were added. Air was exchanged for nitrogen by applying a vacuum and eliminating the vacuum with nitrogen five times, and heating to 125° C. was then effected with stirring at about 800 rpm. Thereafter, with the vacuum pump running and at a pressure 0.1 bar, nitrogen was passed through the mixture from below for 30 minutes. At 125° C., a mixture of 296 g of PO and 197 g of EO was then metered into the reactor in the course of 90 minutes with stirring (800 rpm). After complete epoxide metering, reaction was continued for 45 minutes at 125° C. with stirring, and readily volatile fractions were then distilled off at 90° C. for 30 minutes in a high vacuum. After cooling to room temperature, the product was discharged from the reactor and stabilized by addition of 500 ppm of Irganox 1076. The product is obtained as a clear liquid (OH number: 58.2 mg KOH/g, viscosity at 25° C.: 471 mPa·s).

Preparation of Polyol 8:

350 g of a difunctional polytetrahydrofuranpolyetherpolyol (equivalent weight 325 g/mol OH) were weighed into a 1 l stainless steel reactor and 21.4 mg of DMC catalyst were added. Air was exchanged for nitrogen by applying a vacuum and eliminating the vacuum with nitrogen five times, and heating to 125° C. was then effected with stirring at about 800 rpm. Thereafter, with the vacuum pump running and at a pressure 0.1 bar, nitrogen was passed through the mixture from below for 30 minutes. At 125° C., a mixture of 218 g of PO and 145 g of EO was then metered into the reactor in the course of 70 minutes with stirring (800 rpm). After complete epoxide metering, reaction was continued for 45 minutes at 125° C. with stirring, and readily volatile fractions were then distilled off at 90° C. for 30 minutes in a high vacuum. After cooling to room temperature, the product was discharged from the reactor and stabilized by addition of 500 ppm of Irganox 1076. The product is obtained as a wax which is colourless at room temperature (OH number: 59.2 mg KOH/g, viscosity at 25° C.: 682 mPa·s).

Preparation of Polyol 9:

250 g of a difunctional polytetrahydrofuranpolyetherpolyol (equivalent weight 325 g/mol OH) were weighed into a 1 l stainless steel reactor and 22.1 mg of DMC catalyst were added. Air was exchanged for nitrogen by applying a vacuum and eliminating the vacuum with nitrogen five times, and heating to 125° C. was then effected with stirring at about 800 rpm. Thereafter, with the vacuum pump running and at a pressure 0.1 bar, nitrogen was passed through the mixture from below for 30 minutes. At 125° C., 486 g of PO were metered into the reactor in the course of 60 minutes with stirring (800 rpm). After complete epoxide metering, reaction was continued for 45 minutes at 125° C. with stirring, and readily volatile fractions were then distilled off at 90° C. for 30 minutes in a high vacuum. After cooling to room temperature, the product was discharged from the reactor and stabilized by addition of 500 ppm of Irganox 1076. The product is obtained as a clear liquid (OH number: 55.1 mg KOH/g, viscosity at 25° C.: 536 mPa·s).

Preparation of the Acrylate 3 (Phosphorothioyltris(oxy-4,1-phenyleneiminocarbonyloxyethane-2,1-diyl)triacrylate):

In a 500 ml round-bottom flask, 0.1 g of 2,6-di-tert-butyl-4-methylphenol, 0.05 g of dibutyltin dilaurate (Desmorapid® Z, Bayer MaterialScience AG, Leverkusen, Germany) and 213.07 g of a 27% strength solution of tris(p-isocyanatophenyl)thiophosphate in ethyl acetate (Desmodur® RFE, product of Bayer MaterialScience AG, Leverkusen, Germany) were initially introduced and heated to 60° C. Thereafter, 42.37 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a semicrystalline solid. $n_D^{20}$: 1.610.

Preparation of the acrylate 4 2-({[3-(Methylsulphanyl)phenyl]carbamoyl}oxy)ethyl prop-2-enoate):

In a 100 ml round-bottom flask, 0.02 g of 2,6-di-tert-butyl-4-methylphenol, 0.01 g of Desmorapid® Z, 11.7 g of 3-(methylthio)phenyl isocyanate were initially introduced and heated to 60° C. Thereafter, 8.2 g of 2-hydroxyethyl acrylate were added dropwise and the mixture was further kept at 60° C. until the isocyanate content had fallen below 0.1%. Cooling was then effected. The product was obtained as a light yellow liquid. $n_D^{20}$: 1.626.

Preparation of the acrylate 5 (Mixture of (4-methylbenzene-1,3-diyl)bis[carbamoyloxy-3-(biphenyl-2-yloxy)propane-2,1-diyl]bisacrylate and (4-methylbenzene-1,3-diyl)bis[carbamoyloxy-3-(biphenyl-2-yloxy)propane-1,2-diyl] bisacrylate and analogous isomers):

430.2 g of Denacol EX 142 (Nagase-Chemtex, Japan), 129.7 g of acrylic acid, 1.18 g of triphenylphosphine and 0.0056 g of 2,6-di-tert-butyl-4-methylphenol were initially introduced into a three-necked flask having a reflux condenser and stirrer. In addition, air was slowly passed through and thermostatting at 60° C. was effected. Thereafter, stirring was effected for 24 hours at 90° C. A clear liquid having an OH number of 157.8 mg KOH/g was obtained. 21.3 g of this intermediate and 5.2 g of a mixture of 2,4- and 2,6-toluene diisocyanate (Desmodur T80, Bayer MaterialScience AG, Leverkusen, Germany) were initially introduced into a three-necked flask having a reflux condenser and stirrer. In addition, air was slowly passed through and thermostatting at 60° C. was effected. After an initial exothermic reaction, the product was stirred for 24 hours at 60° C. A clear, colourless, glassy product having an NCO of 0% was obtained. $n_D^{20}$: 1.643.

Preparation of the acrylate 6 (Mixture of (4-methylbenzene-1,3-diyl)bis(carbamoyloxy-3-phenoxypropane-2,1-diyl) bisacrylate and (4-methylbenzene-1,3-diyl)bis(carbamoyloxy-3-phenoxypropane-1,2-diyl)bisacrylate and analogous isomers):

112.7 g of phenyl glycidyl ether, 54 g of acrylic acid, 0.492 g of triphenylphosphine and 0.0017 g of 2,6-di-tert-butyl-4-methylphenol are initially introduced into a three-necked flask having a reflux condenser and stirrer. In addition, air is slowly passed through and thermostatting at 90° C. is then effected. Stirring is effected for 54 hours and a clear, liquid, highly viscous product is obtained. 22.4 g of this product are initially introduced into a three-necked flask having a reflux condenser and stirrer. In addition, air is slowly passed through and thermostatting at 60° C. is effected. 87 g of 2,4-toluidene diisocyanate (Desmodur T100, Bayer MaterialScience AG, Leverkusen, Germany) are now added dropwise in the course of 30 minutes with evolution of heat. Stirring is effected for 20 hours and 0.005 g of dibutyltin dilaurate is then added. A clear, highly viscous product having an NCO of 0% is obtained. $n_D^{20}$: 1.612.

Preparation of the acrylate 7 ({[44 {[(1,1,1,3,3,3-Hexafluoropropan-2-yl)oxy]carbonyl}amino)-phenoxy] phosphorothioyl}bis(oxybenzene-4,1-diylcarbamoyloxyethane-2,1-diyl)bisacrylate):

In a 2 l round-bottom flask, 0.5 g of 2,6-di-tert-butyl-4-methylphenol, 0.25 g of dibutyltin dilaurate (Desmorapid Z, Bayer MaterialScience AG, Leverkusen, Germany) and 1.00 kg of a 27% strength solution of tris(p-isocyanatophenyl)thiophosphate in ethyl acetate (Desmodur® RFE, product of Bayer MaterialScience AG, Leverkusen, Germany) were initially introduced and heated to 60° C. Thereafter, 95.3 g of hexafluoroisopropanol were added dropwise and the temperature was maintained for 8 h. Thereafter, 133.5 g of 2-hydroxyethyl acrylate were added dropwise and the mixture was further kept at 60° C. until the isocyanate content had fallen below 0.1%. Thereafter, cooling was effected and the ethyl acetate was completely removed in vacuo. The product was obtained as a colourless oil. $n_D^{20}$: 1.616.

Preparation of the additive 1(2,2,2-Trifluoroethyl butylcarbamate):

In a 2000 ml round-bottom flask, 0.50 g of Desmorapid Z and 498 g of n-butyl isocyanate were initially introduced and heated to 60° C. Thereafter, 502 g of trifluoroethanol were added dropwise and the mixture was further kept at 60° C. until the isocyanate content had fallen below 0.1%. Cooling was then effected. The product was obtained as a colourless liquid.

The additives 2 to 36 described below in Table 1 were prepared in a manner analogous to that for additive 1, in the stated compositions.

| Additive | Name | Isocyanate and amount | Alcohol and amount | Catalyst and amount | Temp [° C.] | Description |
| --- | --- | --- | --- | --- | --- | --- |
| 2 | 2,2,2-Trifluoroethyl hexylcarbamate | n-Hexyl isocyanate 55.9 g | Trifluoroethanol 44.0 g | Desmorapid Z 0.05 g | 60° C. | Colourless liquid |
| 3 | 1,1,1,3,3,3-Hexafluoropropan-2-yl hexylcarbamate | n-Hexyl isocyanate 10.8 g | Hexafluoro-2-propanol 14.2 g | Desmorapid Z 0.01 g | 60° C. | Colourless liquid |
| 4 | 1,1,1,3,3,3-Hexafluoropropan-2-yl butylcarbamate | n-Butyl isocyanate 9.3 g | Hexafluoro-2-propanol 15.7 g | Desmorapid Z 0.01 g | 60° C. | Colourless solid |
| 5 | Bis(2,2,2-trifluoroethyl)-(2,2,4-trimethylhexane-1,6-diyl) biscarbamate | 2,4,4-Trimethylhexane 1,6-diisocyanate (TMDI) 496 g | Trifluoroethanol 463 g | Desmorapid Z 0.48 G | 60° C. | Colourless liquid |
| 6 | 2,2,3,3,4,4,4-Heptafluorobutyl butylcarbamate | n-Butyl isocyanate 24.8 g | 2,2,3,3,4,4,4-Heptafluorobutanol 50.1 g | Desmorapid Z 0.04 g | 60° C. | Colourless solid |

-continued

| Addi-tive | Name | Isocyanate and amount | Alcohol and amount | Catalyst and amount | Temp [° C.] | Description |
|---|---|---|---|---|---|---|
| 7 | Bis(2,2,3,3,4,4,4-heptafluorobutyl)-[4-({[(2,2,3,3,4,4,4-heptafluorobutoxy)carbonyl]-amino}methyl)octane-1,8-diyl] biscarbamate | 1,8-Diisocyanato-4-(iso-cyanatomethyl)octane (TIN) 5.91 g | 2,2,3,3,4,4,4-Hepta-fluorobutanol 14.1 g | Desmorapid Z 0.01 g | 60° C. | Colourless oil |
| 8 | 2,2,3,3,4,4,5,5,5-Nonafluoropentyl butylcarbamate | n-Butyl isocyanate 4.25 g | 2,2,3,3,4,4,5,5,5-Nona-fluoropentan-1-ol 10.73 g | Desmorapid Z 0.02 g | 70° C. | Colourless liquid |
| 9 | 2,2,3,3,4,4,5,5,5-Nonafluoropentyl hexylcarbamate | n-Hexyl isocyanate 5.05 g | 2,2,3,3,4,4,5,5,5-Nona-fluoropentan-1-ol 9.94 g | Desmorapid Z 0.02 g | 70° C. | Colourless liquid |
| 10 | 2,2,3,3,4,4,5,5,5-Nonafluoropentyl cyclohexylcarbamate | Cyclohexyl isocyanate 5.00 g | 2,2,3,3,4,4,5,5,5-Nona-fluoropentan-1-ol 10.0 g | Desmorapid Z 0.02 g | 70° C. | Colourless solid |
| 11 | Bis(2,2,3,3,4,4,5,5,6,6,7,7-dodecafluoro-heptyl)-(2,2,4-trimethylhexane-1,6-diyl) biscarbamate | 2,4,4-Trimethylhexane 1,6-diisocyanate (TMDI) 3.60 g | 2,2,3,3,4,4,5,5,6,6,7,7-Dodecafluoroheptan-1-ol 11.39 g | Desmorapid Z 0.02 g | 70° C. | Colourless oil |
| 12 | 2,2,3,3,4,4,5,5,6,6,7,7-Dodecafluoroheptyl hexylcarbamate | n-Hexyl isocyanate 4.15 g | 2,2,3,3,4,4,5,5,6,6,7,7-Dodecafluoroheptan-1-ol 10.84 g | Desmorapid Z 0.02 g | 70° C. | Colourless liquid |
| 13 | 2,2,3,3,4,4,5,5,6,6,7,7-Dodecafluoroheptyl propan-2-ylcarbamate | i-Propyl isocyanate 3.06 g | 2,2,3,3,4,4,5,5,6,6,7,7-Dodecafluoroheptan-1-ol 11.93 g | Desmorapid Z 0.02 g | 70° C. | Colourless liquid |
| 14 | 2,2,3,3,4,4,5,5,6,6,7,7-Dodecafluoroheptyl cyclohexylcarbamate | Cyclohexyl isocyanate 4.10 g | 2,2,3,3,4,4,5,5,6,6,7,7-Dodecafluoroheptan-1-ol 10.88 g | Desmorapid Z 0.02 g | 70° C. | Colourless liquid |
| 15 | 2,2,3,4,4,4-Hexafluorobutyl butylcarbamate | n-Butyl isocyanate 5.28 g | 2,2,3,4,4,4-Hexafluoro-butan-1-ol 9.71 g | Desmorapid Z 0.02 g | 70° C. | Colourless liquid |
| 16 | Bis(2,2,3,4,4,4-hexafluorobutyl)-(2,2,4-trimethylhexane-1,6-diyl) biscarbamate | 2,4,4-Trimethylhexane 1,6-diisocyanate (TMDI) 5.48 g | 2,2,3,4,4,4-Hexa-fluorobutan-1-ol 9.50 g | Desmorapid Z 0.02 g | 70° C. | Colourless oil |
| 17 | 2,2,3,4,4,4-Hexafluorobutyl-[3-({[(2,2,3,4,4,4-hexafluorobutoxy)carbonyl]-amino}methyl)-3,5,5-trimethylcyclohexyl] carbamate | 1-Isocyanato-3,3,5-trimethyl-5-isocyanatomethyl-cyclohexane (IPDI) 5.67 g | 2,2,3,4,4,4-Hexa-fluorobutan-1-ol 9.31 g | Desmorapid Z 0.02 g | 70° C. | Colourless oil |
| 18 | 2,2,3,4,4,4-Hexafluorobutyl propan-2-yl-carbamate | i-Propyl isocyanate 4.77 g | 2,2,3,4,4,4-Hexa-fluorobutan-1-ol 10.21 g | Desmorapid Z 0.02 g | 70° C. | Colourless oil |
| 19 | 2,2,3,4,4,4-Hexafluorobutyl cyclohexylcarbamate | Cyclohexyl isocyanate 6.10 g | 2,2,3,4,4,4-Hexa-fluorobutan-1-ol 8.88 g | Desmorapid Z 0.02 g | 70° C. | Colourless solid |
| 20 | 2,2,3,3,4,4,5,5-Octafluoropentyl hexylcarbamate | n-Hexyl isocyanate 5.30 g | 2,2,3,3,4,4,5,5-Octafluoropentan-1-ol 9.69 g | Desmorapid Z 0.02 g | 70° C. | Colourless liquid |
| 21 | 2,2,3,3,4,4,4-Heptafluorobutyl hexylcarbamate | n-Hexyl isocyanate 5.82 g | 2,2,3,3,4,4,4-Hepta-fluorobutan-1-ol 9.16 g | Desmorapid Z 0.02 g | 70° C. | Colourless liquid |
| 22 | 2,2,3,3,4,4,5,5,6,6,7,7,8,8,9,9-Hexadecafluorononyl hexylcarbamate | n-Hexyl isocyanate 3.40 g | 2,2,3,3,4,4,5,5,6,6,7,7,8,8,9,9-Hexadeca-fluorononan-1-ol 11.6 g | Desmorapid Z 0.02 g | 70° C. | Colourless solid |
| 23 | 1,1,1,3,3,3-Hexafluoropropan-2-yl butylcarbamate | n-Butyl isocyanate 6.96 g | 1,1,1-Trifluoropropan-2-ol 8.02 g | Desmorapid Z 0.02 g | 70° C. | Colourless liquid |
| 24 | Bis(1,1,1,3,3,3-hexafluoropropan-2-yl)-{4-[({[(1,1,1,3,3,3-hexafluoropropan-2-yl)oxy]-carbonyl}amino)methyl]octane-1,8-diyl} biscarbamate | 1,8-Diisocyanato-4-(isocyanatomethyl)octane (TIN) 6.36 g | 1,1,1-Trifluoropropan-2-ol 8.62 g | Desmorapid Z 0.02 g | 70° C. | Colourless oil |
| 25 | 1,1,1,3,3,3-Hexafluoropropan-2-yl hexylcarbamate | n-Hexyl isocyanate 7.90 g | 1,1,1-Trifluoropropan-2-ol 7.08 g | Desmorapid Z 0.02 g | 70° C. | Colourless liquid |
| 26 | 1,1,1,3,3,3-Hexafluoropropan-2-yl-propan-2-ylcarbamate | i-Propyl isocyanate 6.40 g | 1,1,1-Trifluoropropan-2-ol 8.58 g | Desmorapid Z 0.02 g | 70° C. | Colourless solid |
| 27 | Bis(2,2,3,3-tetrafluoropropyl)-(cyclohexane-1,3-diyldimethandiyl) biscarbamate | 1,3-Bis-(isocyanatomethyl)-cyclohexane 6.35 g | Tetrafluoro-1-propanol 8.63 g | Desmorapid Z 0.02 g | 70° C. | Colourless solid |
| 28 | 2-Ethylhexyl-2,2,3,3,4,4,5,5,5-nonafluoropentyl hexane-1,6-diylbiscarbamate | Desmodur LD 8.71 g | 2,2,3,3,4,4,5,5,5-Nonafluoropentan-1-ol 6.27 g | Desmorapid Z 0.02 g | 70° C. | Colourless solid |
| 29 | 2,2,3,3,4,4,5,5,6,6,7,7-Dodecafluoroheptyl-2-ethylhexyl hexane-1,6-diylbiscarbamate | Desmodur LD 7.66 g | 2,2,3,3,4,4,5,5,6,6,7,7-Dodecafluoroheptan-1-ol 7.32 g | Desmorapid Z 0.02 g | 70° C. | Colourless solid |
| 30 | Bis(2,2,3,3,4,4,5,5,6,6,7,7-dodecafluoro-heptyl)-(cyclohexane-1,3-diyldimethandiyl) biscarbamate | 1,3-Bis(isocyanatomethyl)-cyclohexane 3.39 g | 2,2,3,3,4,4,5,5,6,6,7,7-Dodecafluorheptan-1-ol 11.6 g | Desmorapid Z 0.02 g | 70° C. | Colourless solid |

-continued

| Additive | Name | Isocyanate and amount | Alcohol and amount | Catalyst and amount | Temp [° C.] | Description |
|---|---|---|---|---|---|---|
| 31 | Bis(1,1,1,3,3,3-hexafluoropropan-2-yl)-(2,2,4-trimethylhexane-1,6-diyl) biscarbamate | 2,4,4-Trimethylhexane-1,6-diisocyanate (TMDI) 50.0 g | Hexafluor-2-propanol 80.0 g | Desmorapid Z 0.07 g | 60° C. | Colourless liquid |
| 32 | 2,2,3,3,4,4,5,5,6,6,7,7,8,8,9,9-Hexadecafluorononyl butylcarbamate | n-Butyl isocyanate 186 g | 2,2,3,3,4,4,5,5,6,6,7,7,8,8,9,9-Hexadecafluorononanol 813 g | Desmorapid Z 0.50 g | 60° C. | Colourless liquid |
| 33 | Bis(2,2,3,3,4,4,4-heptafluorobutyl)-(2,2,4-trimethylhexane-1,6-diyl) biscarbamate | 2,4,4-Trimethylhexane-1,6-diisocyanate (TMDI) 6.88 g | 2,2,3,3,4,4,4-Heptafluorobutanol 13.1 g | Desmorapid Z 0.01 g | 60° C. | Colourless liquid |
| 34 | 2,2,3,3,4,4,5,5,6,6,7,7-Dodecafluoroheptyl butylcarbamate | n-Butyl isocyanate 3.44 g | 2,2,3,3,4,4,5,5,6,6,7,7-Dodecafluoroheptan-1-ol 11.54 g | Desmorapid Z 0.02 g | 70° C. | Colourless liquid |
| 35 | Bis(2,2,3,4,4,4-hexafluorobutyl)-[4-({[(2,2,3,4,4,4-hexafluorobutoxy)carbonyl]-amino}methyl)octane-1,8-diyl] biscarbamate | 1,8-Diisocyanato-4-(isocyanatomethyl)octane (TIN) 4.73 g | 2,2,3,4,4,4-Hexafluorobutan-1-ol 10.25 g | Desmorapid Z 0.02 g | 70° C. | Colourless oil |
| 36 | 2,2,3,3,4,4,5,5,6,6,7,7,8,8,9,9-Hexadecafluorononyl cyclohexylcarbamate | Cyclohexyl isocyanate 3.37 g | 2,2,3,3,4,4,5,5,6,6,7,7,8,8,9,9-Hexadecafluorononan-1-ol 11.61 g | Desmorapid Z 0.02 g | 70° C. | Colourless solid |

Preparation of Additive 37 (Isopropyl Butylcarbamate):

In a 250 ml round-bottom flask, 0.02 g of Desmorapid Z, 31.1 g of n-butyl isocyanate were initially introduced and heated to 60° C. Thereafter, 18.9 g of isopropanol were added dropwise and the mixture was further kept at 60° C. until the isocyanate content had fallen to below 0.1%. Thereafter, cooling was effected and the product was obtained as a clear liquid.

For the production of the holographic media, the writing monomers (component c)), the stabilizers (component d)) (which may already have been predissolved in the component c)) and optionally the auxiliaries and additives (component g)) are dissolved in the isocyanate-reactive component (component b)), optionally at 60° C., 10 or 20 μm glass beads (e.g. from Whitehouse Scientific Ltd, Waverton, Chester, CH3 7PB, United Kingdom) are then added and thoroughly mixed. Thereafter, in the dark or with suitable illumination, the photoinitiator or the photoinitiators (together component e)), in pure form or in dilute solution in N-ethylpyrrolidone (part of component g)) is or are weighed in and mixed again for 1 minute. Optionally, heating to 60° C. is effected for not more than 10 minutes in the drying oven. Thereafter, the isocyanate component (component a)) is added and mixing is effected again in 1 minute. Subsequently, a solution of the catalyst (component f)) is added and mixing is effected again for 1 minute. The mixture obtained is degassed with stirring at <1 mbar for not more than 30 seconds, after which it is distributed over 50×75 mm glass plates and these are each covered with further glass plates. The curing of the PU formulation is effected under 15 kg weights over several hours (usually overnight). In some cases, the media are post cured in light-tight packaging for a further 2 hours at 60° C. The thickness d of the photopolymer layer is obtained as 20 μm from the diameter of the glass spheres used. Since different formulations having different starting viscosity and different curing rate of the matrix do not always lead to the same layer thicknesses d of the photopolymer layer, d is determined separately for each sample on the basis of the characteristics of the recorded holograms. The media of Comparative Examples 1 to 27 and of Examples 1 to 118 were produced analogously to this method.

In the case of the following media, polyol 2 (as component b)) and isocyanate component 2 (as component a)) are always used as matrix building blocks, in particular such as the NCO equivalent weight ratio was 1.02:1 and the total percentage by weight was 100%. All experiments were carried with 0.1% of dyes and 1.0% of coinitiator (together component e)), dissolved in 3.5% of N-ethylpyrrolidone (component g)) and the stated amount of 10% strength solution of catalyst 1 in N-ethylpyrrolidone (component f)).

| | Monomer 1 | Monomer 2 | Coinitiator | Dye | Catalyst 1 | $\Delta n_{max.}$ |
|---|---|---|---|---|---|---|
| Comp. Ex. 1 | Acrylate 4, 30% | — | 1 | Dye 1, 0.05% and dye 2, 0.05% | 0.21% | 0.0172 |
| Comp. Ex. 2 | Acrylate 3, 30% | — | 1 | Dye 1, 0.05% and dye 2, 0.05% | 0.20% | 0.0144 |
| Example 1 | Acrylate 4, 15% | Acrylate 3, 15% | 1 | Dye 1, 0.05% and dye 2, 0.05% | 0.24% | 0.0175 |
| Example 2 | Acrylate 4, 20% | Acrylate 3, 10% | 1 | Dye 1, 0.05% and dye 2, 0.05% | 0.20% | 0.0182 |

|  | Monomer 1 | Monomer 2 | Coinitiator | Dye | Catalyst 1 | $\Delta n_{max.}$ |
| --- | --- | --- | --- | --- | --- | --- |
| Example 3 | Acrylate 4, 22.5% | Acrylate 3, 7.5% | 1 | Dye 1, 0.05% and dye 2, 0.05% | 0.20% | 0.0203 |
| Comp. Ex. 3 | Acrylate 1, 40% | — | 1 | Dye 1, 0.10% | 0.20% | 0 |
| Comp. Ex. 4 | Acrylate 3, 40% | — | 1 | Dye 1, 0.10% | 0.20% | 0.0172 |
| Comp. Ex. 5 | Acrylate 4, 40% | — | 1 | Dye 1, 0.10% | 0.20% | 0.0140 |
| Example 4 | Acrylate 1, 20% | Acrylate 3, 20% | 1 | Dye 1, 0.10% | 0.21% | 0.0197 |
| Example 5 | Acrylate 1, 20% | Acrylate 4, 20% | 1 | Dye 2, 0.10% | 0.18% | 0.0211 |
| Example 6 | Acrylate 3, 20% | Acrylate 4, 20% | 1 | Dye 2, 0.10% | 0.17% | 0.0206 |

In the case of the following media, polyol 1 (as component b)) and isocyanate component 1 (as component a)) were always used as matrix building blocks, in particular such that the NCO:OH ratio was 1.02:1 and the total percentage by weight is 100%:

|  | Monomer 1 | Monomer 2 | Coinitiator | Dye | Catalyst 1 | $\Delta n_{max.}$ |
| --- | --- | --- | --- | --- | --- | --- |
| Comp. Ex. 6 | Acrylate 3, 30% | — | 1 | Dye 1, 0.10% | 0.02%* | 0.0091 |
| Comp. Ex. 7 | Acrylate 3, 40% | — | 1 | Dye 1, 0.10% | 0.06% | 0.0079 |
| Comp. Ex. 8 | Acrylate 3, 50% | — | 1 | Dye 1, 0.10% | 0.10% | 0.0045 |
| Comp. Ex. 9 | Acrylate 2, 30% | — | 1 | Dye 1, 0.10% | 0.20% | 0.0002 |
| Comp. Ex. 10 | Acrylate 2, 40% | — | 1 | Dye 1, 0.10% | 0.20% | 0.0002 |
| Example 7 | Acrylate 3, 20% | Acrylate 2, 20% | 1 | Dye 1, 0.10% | 0.20% | 0.0094 |
| Comp. Ex. 11 | Acrylate 4, 30% | — | 1 | Dye 1, 0.10% | 0.10% | 0.0056 |
| Comp. Ex. 12 | Acrylate 4, 40% | — | 1 | Dye 1, 0.10% | 0.10% | 0.0096 |
| Comp. Ex. 13 | Acrylate 4, 50% | — | 1 | Dye 1, 0.10% | 0.10% | 0.0112 |
| Example 8 | Acrylate 3, 15% | Acrylate 4, 15% | 1 | Dye 1, 0.10% | 0.10% | 0.0127 |
| Example 9 | Acrylate 3, 20% | Acrylate 4, 20% | 1 | Dye 1, 0.10% | 0.06% | 0.0140 |
| Example 10 | Acrylate 3, 25% | Acrylate 4, 25% | 1 | Dye 1, 0.10% | 0.10% | 0.0149 |
| Comp. Ex. 14 | Acrylate 5, 40% | — | 1 | Dye 1, 0.10% | 0.20% | 0.0088 |
| Example 11 | Acrylate 5, 30% | Acrylate 4, 10% | 1 | Dye 1, 0.10% | 0.20% | 0.0139 |
| Example 12 | Acrylate 5, 20% | Acrylate 4, 20% | 1 | Dye 1, 0.10% | 0.20% | 0.0140 |
| Example 13 | Acrylate 5, 10% | Acrylate 4, 30% | 1 | Dye 1, 0.10% | 0.20% | 0.0147 |

*used as 10% strength solution in butyl acetate.

In the case of the following media, polyol 3 (as component b)) and isocyanate component 3 (as component a)) were always used as matrix building blocks, in particular such that the NCO:OH ratio was 1.02:1 and the total percentage by weight is 100%:

|  | Monomer 1 | Monomer 2 | Coinitiator | Dye | Catalyst 1 | $\Delta n_{max.}$ |
| --- | --- | --- | --- | --- | --- | --- |
| Comp. Ex. 15 | Acrylate 1, 40% | — | 1 | Dye 3, 0.10% | 0.20% | 0.0094 |

|  | Monomer 1 | Monomer 2 | Coinitiator | Dye | Catalyst | $\Delta n_{max.}$ |
| --- | --- | --- | --- | --- | --- | --- |
| Comp. Ex. 16 | Acrylate 3, 40% | — | 1 | Dye 3, 0.10% | 0.20% | 0.0152 |
| Comp. Ex. 17 | Acrylate 3, 50% | — | 1 | Dye 3, 0.10% | 0.20% | 0.0116 |
| Comp. Ex. 18 | Acrylate 4, 40% | — | 1 | Dye 3, 0.10% | 0.20% | 0.0148 |
| Comp. Ex. 19 | Acrylate 4, 50% | — | 1 | Dye 3, 0.10% | 0.20% | 0.0134 |
| Example 14 | Acrylate 1, 20% | Acrylate 3, 20% | 1 | Dye 3, 0.10% | 0.20% | 0.0114 |
| Example 15 | Acrylate 1, 20% | Acrylate 3, 20% | 1 | Dye 1, 0.10% | 0.20% | 0.0206 |
| Example 16 | Acrylate 3, 20% | Acrylate 4, 20% | 1 | Dye 3, 0.10% | 0.20% | 0.0225 |
| Example 17 | Acrylate 3, 25% | Acrylate 4, 25% | 1 | Dye 3, 0.10% | 0.17% | 0.0260 |
| Example 18 | Acrylate 3, 15% | Acrylate 4, 35% | 1 | Dye 3, 0.10% | 0.18% | 0.0264 |

In the case of the following media, polyol 3 (as component b)) and isocyanate component 4 (as component a)) were always used as matrix building blocks, in particular such that the NCO:OH ratio was 1.02:1 and the total percentage by weight is 100%:

|  | Monomer 1 | Monomer 2 | Coinitiator | Dye | Catalyst | $\Delta n_{max.}$ |
| --- | --- | --- | --- | --- | --- | --- |
| Comp. Ex. 20 | Acrylate 3, 40% | — | 1 | Dye 3, 0.10% | 0.20% | 0.0105 |
| Comp. Ex. 21 | Acrylate 3, 50% | — | 1 | Dye 3, 0.10% | 0.20% | 0.0078 |
| Comp. Ex. 22 | Acrylate 4, 40% | — | 1 | Dye 3, 0.10% | 0.20% | 0.0127 |
| Comp. Ex. 23 | Acrylate 4, 50% | — | 1 | Dye 3, 0.10% | 0.20% | 0.0130 |
| Example 19 | Acrylate 3, 20% | Acrylate 4, 20% | 1 | Dye 3, 0.10% | 0.21% | 0.0197 |
| Example 20 | Acrylate 3, 25% | Acrylate 4, 25% | 1 | Dye 3, 0.10% | 0.19% | 0.0330 |
| Example 21 | Acrylate 3, 15% | Acrylate 4, 35% | 1 | Dye 3, 0.10% | 0.20% | 0.0297 |

In the case of the following media, polyol 4 (as component b)) and isocyanate component 4 (as component a)) were always used as matrix building blocks, in particular such that the NCO:OH ratio was 1.02:1 and the total percentage by weight is 100%:

|  | Monomer 1 | Monomer2 | Coinitiator | Dye | Catalyst | $\Delta n_{max.}$ |
| --- | --- | --- | --- | --- | --- | --- |
| Comp. Ex. 24 | Acrylate 3, 40% | — | Coinitiator 1, 1.0% | Dye 1, 0.10% | 0.20% | 0.0171 |
| Comp. Ex. 25 | Acrylate 3, 50% | — | Coinitiator 1, 1.0% | Dye 1, 0.10% | 0.20% | 0.0159 |
| Comp. Ex. 26 | Acrylate 4, 40% | — | Coinitiator 1, 1.0% | Dye 1, 0.10% | 0.20% | 0.0068 |
| Comp. Ex. 27 | Acrylate 4, 50% | — | Coinitiator 1, 1.0% | Dye 1, 0.10% | 0.20% | 0.0055 |
| Example 22 | Acrylate 3, 30% | Acrylate 4, 10% | Coinitiator 1, 1.0% | Dye 1, 0.10% | 0.20% | 0.0178 |
| Example 23 | Acrylate 3, 20% | Acrylate 4, 20% | Coinitiator 1, 1.0% | Dye 1, 0.10% | 0.20% | 0.0189 |
| Example 24 | Acrylate 3, 10% | Acrylate 4, 30% | Coinitiator 1, 1.0% | Dye 1, 0.10% | 0.20% | 0.0177 |
| Example 25 | Acrylate 3, 20% | Acrylate 4, 20% | Coinitiator 2, 3.0% | Dye 1, 0.10% | 0.20% | 0.0211 |
| Example 26 | Acrylate 3, 25% | Acrylate 4, 25% | Coinitiator 1, 1.0% | Dye 1, 0.10% | 0.20% | 0.0185 |

The following will be shown as examples of the formulation mentioned as being preferred (with (fluoro)urethanes as additive):

In the case of the following media, polyol 1 (as component b)) and isocyanate component 1 (as component a)) were always used as matrix building blocks, in particular such that the NCO:OH was 1.02:1 and the total percentage by weight is 100%. Here, 20% by weight of acrylate 3, 20% by weight of acrylate 4 (together component c)), 0.060% by weight of the 10% strength solution of catalyst 1 in N-ethylpyrrolidone (component f)), 1.0% by weight of coinitiator 1 and 0.10% by weight of dye 1 (together component e)) and 15% by weight of the corresponding additive (component g)) are always used:

|  | Additive | $\Delta n_{max.}$ |
|---|---|---|
| Example 27 | 1 | 0.0253 |
| Example 28 | 2 | 0.0238 |
| Example 29 | 3 | 0.0302 |
| Example 30 | 4 | 0.0305 |
| Example 31 | 5 | 0.0205 |
| Example 32 | 6 | 0.0310 |
| Example 33 | 7 | 0.0175 |
| Example 34 | 8 | 0.0365 |
| Example 35 | 9 | 0.0348 |
| Example 36 | 10 | 0.0295 |
| Example 37 | 11 | 0.0320 |
| Example 38 | 12 | 0.0310 |
| Example 39 | 13 | 0.0310 |
| Example 40 | 14 | 0.0245 |
| Example 41 | 15 | 0.0250 |
| Example 42 | 16 | 0.0250 |

-continued

|  | Additive | $\Delta n_{max.}$ |
|---|---|---|
| Example 43 | 17 | 0.0230 |
| Example 44 | 18 | 0.0260 |
| Example 45 | 19 | 0.0225 |
| Example 46 | 20 | 0.0239 |
| Example 47 | 21 | 0.0286 |
| Example 48 | 22 | 0.0283 |
| Example 49 | 23 | 0.0220 |
| Example 50 | 24 | 0.0229 |
| Example 51 | 25 | 0.0235 |
| Example 52 | 26 | 0.0245 |
| Example 53 | 27 | 0.0184 |
| Example 54 | 28 | 0.0260 |
| Example 55 | 29 | 0.0269 |
| Example 56 | 30 | 0.0305 |

In the case of the following media, the following components were used. The difference between the sum of the percentage by weight and 100% corresponds in each case to the amount of N-ethylpyrrolidone which was used for dissolving dye and coinitiator:

| Example No. | Polyol No. (as component b)) | Proportion (% by weight) | Isocyanate component (as component a)) | Proportion (% by weight) | Acrylate No. (1st monomer) (component c)) | Proportion (% by weight) | Acrylate No. (2nd monomer) (component c)) | Proportion (% by weight) |
|---|---|---|---|---|---|---|---|---|
| 57 | 1 | 34.1 | 1 | 6.3 | 5 | 20 | 4 | 20 |
| 58 | 1 | 34.0 | 1 | 6.2 | 3 | 20 | 7 | 20 |
| 59 | 1 | 38.3 | 1 | 7.0 | 3 | 15 | 4 | 15 |
| 60 | 2 | 29.5 | 2 | 10.8 | 3 | 15 | 4 | 15 |
| 61 | 10 | 23.8 | 2 | 16.4 | 3 | 25 | 4 | 15 |
| 62 | 4 | 36.4 | 3 | 3.8 | 3 | 15 | 4 | 15 |
| 63 | 4 | 36.4 | 3 | 3.8 | 3 | 15 | 4 | 15 |
| 64 | 4 | 36.4 | 3 | 3.8 | 3 | 25 | 4 | 15 |
| 65 | 4 | 36.4 | 3 | 3.8 | 3 | 25 | 4 | 15 |
| 66 | 4 | 36.4 | 3 | 3.8 | 3 | 25 | 4 | 15 |
| 67 | 4 | 36.4 | 3 | 3.8 | 3 | 25 | 4 | 15 |
| 68 | 4 | 36.4 | 3 | 3.8 | 3 | 25 | 4 | 15 |
| 69 | 5 | 36.7 | 3 | 3.5 | 3 | 25 | 4 | 15 |
| 70 | 5 | 36.7 | 3 | 3.5 | 3 | 25 | 4 | 15 |
| 71 | 4 | 36.4 | 3 | 3.8 | 6 | 25 | 4 | 15 |
| 72 | 4 | 35.4 | 4 | 4.8 | 3 | 25 | 4 | 15 |
| 73 | 4 | 35.4 | 4 | 4.8 | 3 | 15 | 4 | 15 |
| 74 | 4 | 35.9 | 4 | 4.3 | 3 | 25 | 4 | 15 |
| 75 | 4 | 35.4 | 4 | 4.8 | 3 | 25 | 4 | 15 |
| 76 | 4 | 35.4 | 4 | 4.8 | 3 | 25 | 4 | 15 |
| 77 | 4 | 35.4 | 4 | 4.8 | 3 | 30 | 4 | 10 |
| 78 | 4 | 35.4 | 4 | 4.8 | 3 | 20 | 4 | 20 |
| 79 | 4 | 35.4 | 4 | 4.8 | 3 | 15 | 4 | 25 |
| 80 | 4 | 35.4 | 4 | 4.8 | 3 | 10 | 4 | 30 |
| 81 | 4 | 34.4 | 4 | 4.8 | 3 | 5 | 4 | 35 |
| 82 | 4 | 35.4 | 4 | 4.8 | 3 | 15 | 4 | 15 |
| 83 | 4 | 35.4 | 4 | 4.8 | 3 | 25 | 4 | 5 |
| 84 | 4 | 35.4 | 4 | 4.8 | 3 | 5 | 4 | 25 |
| 85 | 4 | 35.4 | 4 | 4.8 | 5 | 20 | 4 | 20 |
| 86 | 4 | 35.4 | 4 | 4.8 | 3 | 25 | 4 | 15 |
| 87 | 4 | 35.4 | 4 | 4.8 | 3 | 25 | 4 | 15 |
| 88 | 4 | 35.7 | 4 | 4.6 | 3 | 25 | 4 | 15 |
| 89 | 4 | 35.4 | 4 | 4.8 | 3 | 20 | 4 | 20 |
| 90 | 4 | 35.4 | 4 | 4.8 | 3 | 20 | 4 | 20 |
| 91 | 4 | 35.4 | 4 | 4.8 | 3 | 20 | 4 | 20 |
| 92 | 4 | 35.4 | 4 | 4.8 | 3 | 20 | 4 | 20 |
| 93 | 4 | 33.7 | 4 | 4.6 | 3 | 20 | 4 | 20 |
| 94 | 4 | 33.7 | 4 | 4.6 | 3 | 20 | 4 | 20 |
| 95 | 4 | 31.4 | 4 | 3.8 | 3 | 20 | 4 | 20 |
| 96 | 4 | 31.4 | 4 | 3.8 | 3 | 20 | 4 | 20 |
| 97 | 4 | 35.4 | 4 | 4.8 | 3 | 15 | 7 | 15 |
| 98 | 4 | 35.4 | 4 | 4.8 | 3 | 20 | 7 | 20 |
| 99 | 4 | 35.4 | 4 | 4.8 | 3 | 20 | 5 | 20 |
| 100 | 4 | 35.4 | 4 | 4.8 | 3 | 15 | 5 | 15 |
| 101 | 5 | 35.7 | 4 | 4.5 | 3 | 20 | 4 | 20 |
| 102 | 5 | 31.3 | 4 | 4.0 | 3 | 20 | 4 | 20 |
| 103 | 5 | 35.7 | 4 | 4.5 | 3 | 25 | 4 | 15 |
| 104 | 7 | 31.7 | 4 | 8.6 | 3 | 25 | 4 | 15 |
| 105 | 8 | 31.6 | 4 | 8.6 | 3 | 25 | 4 | 15 |

| | | | | | | | | |
|---|---|---|---|---|---|---|---|---|
| 106 | 7 | 31.7 | 4 | 8.6 | 3 | 25 | 4 | 15 |
| 107 | 8 | 31.6 | 4 | 8.6 | 3 | 25 | 4 | 15 |
| 108 | 9 | 32.1 | 4 | 8.1 | 3 | 25 | 4 | 15 |
| 109 | 3 | 32.3 | 1 | 2.9 | 3 | 20 | 4 | 20 |
| 110 | 6 | 32.4 | 1 | 2.9 | 3 | 20 | 4 | 20 |
| 111 | 6 | 32.4 | 1 | 2.9 | 3 | 20 | 4 | 20 |
| 112 | 6 | 31.4 | 4 | 3.9 | 3 | 20 | 4 | 20 |
| 113 | 6 | 31.4 | 4 | 3.9 | 3 | 20 | 4 | 20 |
| 114 | 6 | 31.4 | 4 | 3.9 | 3 | 20 | 4 | 20 |
| 115 | 4 | 33.4 | 5 | 6.8 | 3 | 25 | 4 | 15 |
| 116 | 4 | 31.2 | 5 | 7.1 | 3 | 25 | 4 | 15 |
| 117 | 4 | 36.9 | 6 | 3.3 | 3 | 25 | 4 | 15 |
| 118 | 4 | 29.3 | 2 | 11.0 | 3 | 25 | 4 | 15 |

| Example No. | Additive No. (component g)) | Proportion (% by weight) | Coinitiator (component e)) | Proportion (% by weight) | Dye (component e)) | Proportion (% by weight) | Catalyst 1 (% by weight) (component f)) | Δn (max.) |
|---|---|---|---|---|---|---|---|---|
| 57 | 11 | 15 | 1 | 1.0 | 1 | 0.1 | 0.06 | 0.0355 |
| 58 | 11 | 15 | 1 | 1.0 | 1 | 0.1 | 0.20 | 0.0261 |
| 59 | 37 | 20 | 1 | 1.0 | 1 | 0.1 | 0.20 | 0.0157 |
| 60 | 11 | 25 | 1 | 1.0 | 1 | 0.1 | 0.20 | 0.0330 |
| 61 | 32 | 15 | 1 | 1.0 | 1 | 0.1 | 0.21 | 0.0265 |
| 62 | 32 | 25 | 1 | 1.0 | 1 | 0.1 | 0.20 | 0.0370 |
| 63 | 6 | 25 | 1 | 1.0 | 1 | 0.1 | 0.20 | 0.0376 |
| 64 | 32 | 15 | 1 | 1.0 | 1 | 0.1 | 0.20 | 0.0375 |
| 65 | 6 | 15 | 1 | 1.0 | 1 | 0.1 | 0.20 | 0.0385 |
| 66 | 31 | 15 | 1 | 1.0 | 1 | 0.1 | 0.21 | 0.0400 |
| 67 | 6 | 15 | 1 | 1.0 | 3 | 0.1 | 0.22 | 0.0410 |
| 68 | 31 | 15 | 1 | 1.0 | 3 | 0.1 | 0.20 | 0.0390 |
| 69 | 32 | 15 | 1 | 1.0 | 1 | 0.1 | 0.21 | 0.0480 |
| 70 | 33 | 15 | 1 | 1.0 | 1 | 0.1 | 0.20 | 0.0450 |
| 71 | 31 | 15 | 1 | 1.0 | 1 | 0.1 | 0.21 | 0.0284 |
| 72 | 32 | 15 | 1 | 1.0 | 1 | 0.1 | 0.21 | 0.0370 |
| 73 | 32 | 25 | 1 | 1.0 | 1 | 0.1 | 0.20 | 0.0365 |
| 74 | 32 | 15 | 1 | 1.0 | 3 | 0.1 | 0.20 | 0.0430 |
| 75 | 36 | 15 | 1 | 1.0 | 1 | 0.1 | 0.19 | 0.0330 |
| 76 | 21 | 15 | 1 | 1.0 | 1 | 0.1 | 0.20 | 0.0375 |
| 77 | 11 | 15 | 1 | 1.0 | 1 | 0.1 | 0.22 | 0.0373 |
| 78 | 11 | 15 | 1 | 1.0 | 1 | 0.1 | 0.18 | 0.0397 |
| 79 | 11 | 15 | 1 | 1.0 | 1 | 0.1 | 0.20 | 0.0414 |
| 80 | 11 | 15 | 1 | 1.0 | 1 | 0.1 | 0.18 | 0.0391 |
| 81 | 11 | 15 | 1 | 1.0 | 1 | 0.1 | 0.20 | 0.0376 |
| 82 | 11 | 25 | 1 | 1.0 | 1 | 0.1 | 0.20 | 0.0387 |
| 83 | 11 | 25 | 1 | 1.0 | 1 | 0.1 | 0.21 | 0.0382 |
| 84 | 11 | 25 | 1 | 1.0 | 1 | 0.1 | 0.20 | 0.0331 |
| 85 | 11 | 15 | 1 | 1.0 | 1 | 0.1 | 0.20 | 0.0295 |
| 86 | 34 | 15 | 1 | 1.0 | 1 | 0.1 | 0.20 | 0.0365 |
| 87 | 35 | 15 | 1 | 1.0 | 1 | 0.1 | 0.20 | 0.0340 |
| 88 | 31 | 15 | 1 | 1.0 | 1 | 0.1 | 0.20 | 0.0375 |
| 89 | 8 | 15 | 1 | 1.0 | 1 | 0.1 | 0.21 | 0.0398 |
| 90 | 9 | 15 | 1 | 1.0 | 1 | 0.1 | 0.21 | 0.0365 |
| 91 | 10 | 15 | 1 | 1.0 | 1 | 0.1 | 0.20 | 0.0278 |
| 92 | 24 | 15 | 1 | 1.0 | 1 | 0.1 | 0.20 | 0.0245 |
| 93 | 11 | 15 | 2 | 3.0 | 1 | 0.1 | 0.20 | 0.0435 |
| 94 | 36 | 15 | 2 | 3.0 | 1 | 0.1 | 0.20 | 0.0379 |
| 95 | 31 | 20 | 1 | 1.0 | 2 | 0.1 | 0.20 | 0.0455 |
| 96 | 11 | 20 | 1 | 1.0 | 2 | 0.1 | 0.21 | 0.0450 |
| 97 | 11 | 25 | 1 | 1.0 | 1 | 0.1 | 0.20 | 0.0289 |
| 98 | 11 | 15 | 1 | 1.0 | 1 | 0.1 | 0.20 | 0.0280 |
| 99 | 11 | 15 | 1 | 1.0 | 1 | 0.1 | 0.20 | 0.0300 |
| 100 | 11 | 25 | 1 | 1.0 | 1 | 0.1 | 0.20 | 0.0280 |
| 101 | 33 | 15 | 1 | 1.0 | 1 | 0.1 | 0.20 | 0.0436 |
| 102 | 32 | 20 | 1 | 1.0 | 2 | 0.1 | 0.21 | 0.0470 |
| 103 | 21 | 15 | 1 | 1.0 | 2 | 0.1 | 0.20 | 0.0361 |
| 104 | 32 | 15 | 1 | 1.0 | 1 | 0.1 | 0.20 | 0.0379 |
| 105 | 32 | 15 | 1 | 1.0 | 1 | 0.1 | 0.20 | 0.0377 |
| 106 | 11 | 15 | 1 | 1.0 | 1 | 0.1 | 0.20 | 0.0324 |
| 107 | 11 | 15 | 1 | 1.0 | 1 | 0.1 | 0.20 | 0.0334 |
| 108 | 11 | 15 | 1 | 1.0 | 1 | 0.1 | 0.20 | 0.0337 |
| 109 | 32 | 20 | 1 | 1.0 | 2 | 0.1 | 0.21 | 0.0389 |
| 110 | 32 | 20 | 1 | 1.0 | 2 | 0.1 | 0.19 | 0.0400 |
| 111 | 21 | 20 | 1 | 1.0 | 2 | 0.1 | 0.20 | 0.0440 |
| 112 | 32 | 20 | 1 | 1.0 | 2 | 0.1 | 0.22 | 0.0415 |
| 113 | 21 | 20 | 1 | 1.0 | 2 | 0.1 | 0.20 | 0.0400 |
| 114 | 22 | 20 | 1 | 1.0 | 2 | 0.1 | 0.20 | 0.0470 |

-continued

| 115 | 32 | 15 | 1 | 1.0 | 1 | 0.1 | 0.20 | 0.0430 |
| 116 | 32 | 15 | 2 | 3.0 | 1 | 0.1 | 0.20 | 0.0483 |
| 117 | 32 | 15 | 1 | 1.0 | 1 | 0.1 | 0.20 | 0.0402 |
| 118 | 32 | 15 | 1 | 1.0 | 1 | 0.1 | 0.20 | 0.0360 |

The invention claimed is:

1. A photopolymer formulation comprising matrix polymers, a combination of at least two different writing monomers and photoinitiators, wherein the matrix polymers comprise polyurethanes, and wherein the at least two different writing monomers differ in their respective refractive indices $n_D^{20}$, measured at a wavelength of 405 nm, by not more than 0.200 and in each case have a refractive index $n_D^{20}$ of ≥1.45, measured at a wavelength of 405 nm, wherein the at least two different writing monomers comprise urethane acrylates and/or urethane methacrylates and wherein the photopolymer formulation further comprises plasticizers comprising fluorinated urethanes.

2. The photopolymer formulation according to claim 1, wherein the at least two different writing monomers differ in their respective refractive indices $n_D^{20}$, measured at a wavelength of 405 nm, by not more than 0.100 and have in each case a refractive index $n_D^{20}$, measured at a wavelength of 405 nm, of ≥1.50.

3. A process for the preparation of a photopolymer formulation according to claim 2, comprising mixing matrix polymers, writing monomers, photoinitiators, optionally plasticizers and optionally further additives to form a photopolymer formulation.

4. A process for exposing holographic media comprising the photopolymer formulation according to claim 2, wherein the process comprises selectively polymerizing the writing monomers by electromagnetic radiation.

5. The photopolymer formulation according to claim 1, wherein the at least two different writing monomers differ in their respective refractive indices $n_D^{20}$, measured at a wavelength of 405 nm, by not more than 0.065 and have in each case a refractive index $n_D^{20}$, measured at a wavelength of 405 nm, of ≥1.55.

6. The photopolymer formulation according to claim 1, wherein the at least two different writing monomers are mono-, di-, tri- and/or polyfunctional.

7. The photopolymer formulation according to claim 6, wherein the at least two different writing monomers comprise a combination of said monofunctional and of said polyfunctional writing monomers or a combination of said-di- and said trifunctional writing monomers.

8. The photopolymer formulation according to claim 1, wherein the matrix polymers comprise polyurethanes which are obtained by reacting an isocyanate component a) with an isocyanate-reactive component b).

9. The photopolymer formulation according to claim 1, wherein the photoinitiators comprise initiators which can be activated by actinic radiation.

10. The photopolymer formulation according to claim 1, wherein the fluorinated urethanes plasticizers have the formula IV

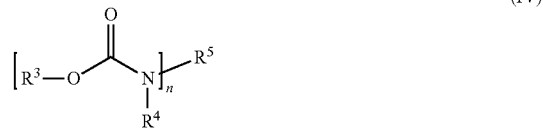

wherein
n is from 1 to 8 and
$R^3$, $R^4$, $R^5$, independently of one another, represent hydrogen or linear, branched, cyclic or heterocyclic organic radicals which are unsubstituted or optionally also substituted by heteroatoms and wherein at least one of the radicals $R^3$, $R^4$, $R^5$ are substituted by at least one fluorine atom.

11. The photopolymer formulation according to claim 10, wherein $R^3$ is an organic radical having at least one fluorine atom.

12. The photopolymer formulation according to claim 1, wherein the photopolymer formulation consists essentially of
 10 to 89.999% by weight, of the matrix polymers,
 10 to 60% by weight, of the writing monomers,
 0.001 to 5% by weight of the photoinitiators and
 optionally 0 to 4% by weight, of catalysts,
 optionally 0 to 5% by weight, of free radical stabilizers,
 optionally 0 to 30% by weight, of plasticizers and
 optionally 0 to 5% by weight, of further additives,
 wherein the sum of all constituents being 100% by weight.

13. The photopolymer formulation according to claim 1, wherein the photopolymer formulation consists essentially of
 25 to 70% by weight, of the matrix polymers,
 25 to 50% by weight, of the writing monomers,
 0.001 to 5% by weight of the photoinitiators, and
 optionally 0 to 2% by weight, of catalysts,
 0.001 to 1% by weight, of free radical stabilizers,
 0.1 to 25% by weight, of plasticizers and
 0.1 to 5% by weight, of further additives,
 wherein the sum of all constituents being 100% by weight.

14. Holographic elements or images formed from the photopolymer formulation according to claim 1.

* * * * *